US012588210B2

(12) United States Patent
Kanno

(10) Patent No.: US 12,588,210 B2
(45) Date of Patent: Mar. 24, 2026

(54) SEMICONDUCTOR MEMORY DEVICE

(71) Applicant: Kioxia Corporation, Tokyo (JP)

(72) Inventor: Hiroshi Kanno, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 302 days.

(21) Appl. No.: 18/460,509

(22) Filed: Sep. 1, 2023

(65) Prior Publication Data

US 2024/0099002 A1 Mar. 21, 2024

(30) Foreign Application Priority Data

Sep. 20, 2022 (JP) ................................. 2022-149301

(51) Int. Cl.
H10B 43/27 (2023.01)
H10B 41/27 (2023.01)

(52) U.S. Cl.
CPC ............. H10B 43/27 (2023.02); H10B 41/27 (2023.02)

(58) Field of Classification Search
CPC ......... H10B 41/27; H10B 43/27; H10B 43/10
See application file for complete search history.

(56) References Cited

U.S. PATENT DOCUMENTS

| | | | | |
|---|---|---|---|---|
| 10,020,319 | B2 * | 7/2018 | Baba | .................. H10D 30/0413 |
| 10,797,072 | B2 | 10/2020 | Inatsuka | |
| RE48,473 | E | 3/2021 | Lee | |
| 2017/0162594 | A1 * | 6/2017 | Ahn | ........................ H10B 41/27 |
| 2020/0303300 | A1 * | 9/2020 | Kato | .................. H01L 23/5226 |
| 2022/0093632 | A1 | 3/2022 | Sakaguchi | |

FOREIGN PATENT DOCUMENTS

| | | |
|---|---|---|
| TW | I770363 B | 7/2022 |
| TW | I776477 B | 9/2022 |

* cited by examiner

*Primary Examiner* — Evren Seven
(74) *Attorney, Agent, or Firm* — Kim & Stewart LLP

(57) ABSTRACT

According to one embodiment, a semiconductor memory device includes a first wiring layer above a first semiconductor layer in a first direction and a second wiring layer above the first semiconductor layer and spaced from the first wiring layer in a second direction. A first memory pillar extends through the first wiring layer. A second memory pillar extends through the second wiring layer. A member is between the first and second wiring layers in the second direction and includes a first conductor contacting the first semiconductor layer, a first insulator between the wiring layers and the first conductor, and a plurality of second insulators arranged along a third direction and between the first conductor and the first semiconductor layer in the first direction.

20 Claims, 28 Drawing Sheets

SEMICONDUCTOR MEMORY DEVICE

CROSS-REFERENCE TO RELATED APPLICATION

This application is based upon and claims the benefit of priority from Japanese Patent Application No. 2022-149301, filed Sep. 20, 2022, the entire contents of which are incorporated herein by reference.

FIELD

Embodiments described herein relate generally to a semiconductor memory device.

BACKGROUND

A NAND flash memory is known as a semiconductor memory device.

DETAILED DESCRIPTION

In general, according to one embodiment, a semiconductor memory device includes a first semiconductor layer, a first wiring layer above the first semiconductor layer in a first direction, a second wiring layer above the first semiconductor layer in the first direction and spaced from the first wiring layer in a second direction intersecting the first direction, a first memory pillar extending in the first direction through the first wiring layer and having a lower end connected to the first semiconductor layer, a second memory pillar extending in the first direction through the second wiring layer and having a lower end connected to the first semiconductor layer, and a first member above the first semiconductor layer in the first direction, between the first and second wiring layers in the second direction, and extending in a third direction orthogonal to the first and second direction. The first member includes a first conductor extending in the first direction and contacting the first semiconductor layer, a first insulator between the first wiring layer and the first conductor in the second direction and between the second wiring layer and the first conductor in the second direction, and a plurality of second insulators arranged along the third direction and between the first conductor and the first semiconductor layer in the first direction.

Hereinafter, certain example embodiments will be described with reference to the drawings. In the description, components having substantially the same function and configuration are denoted by the same reference symbols. Each embodiment illustrated below exemplifies an apparatus and/or a method embodying technical concepts of the present disclosure, however, the technical concepts are not necessarily limited to the material, shape, structure, arrangement, and the like of components as described below in the examples. The embodiments can be modified in various ways while still incorporating the relevant technical concepts.

1. First Embodiment

A semiconductor memory device 1 according to a first embodiment will be described. A three-dimensional stacked NAND flash memory in which memory cell transistors are three-dimensionally stacked above a semiconductor substrate will be described below as an example of the semiconductor memory device 1.

Figure 1:
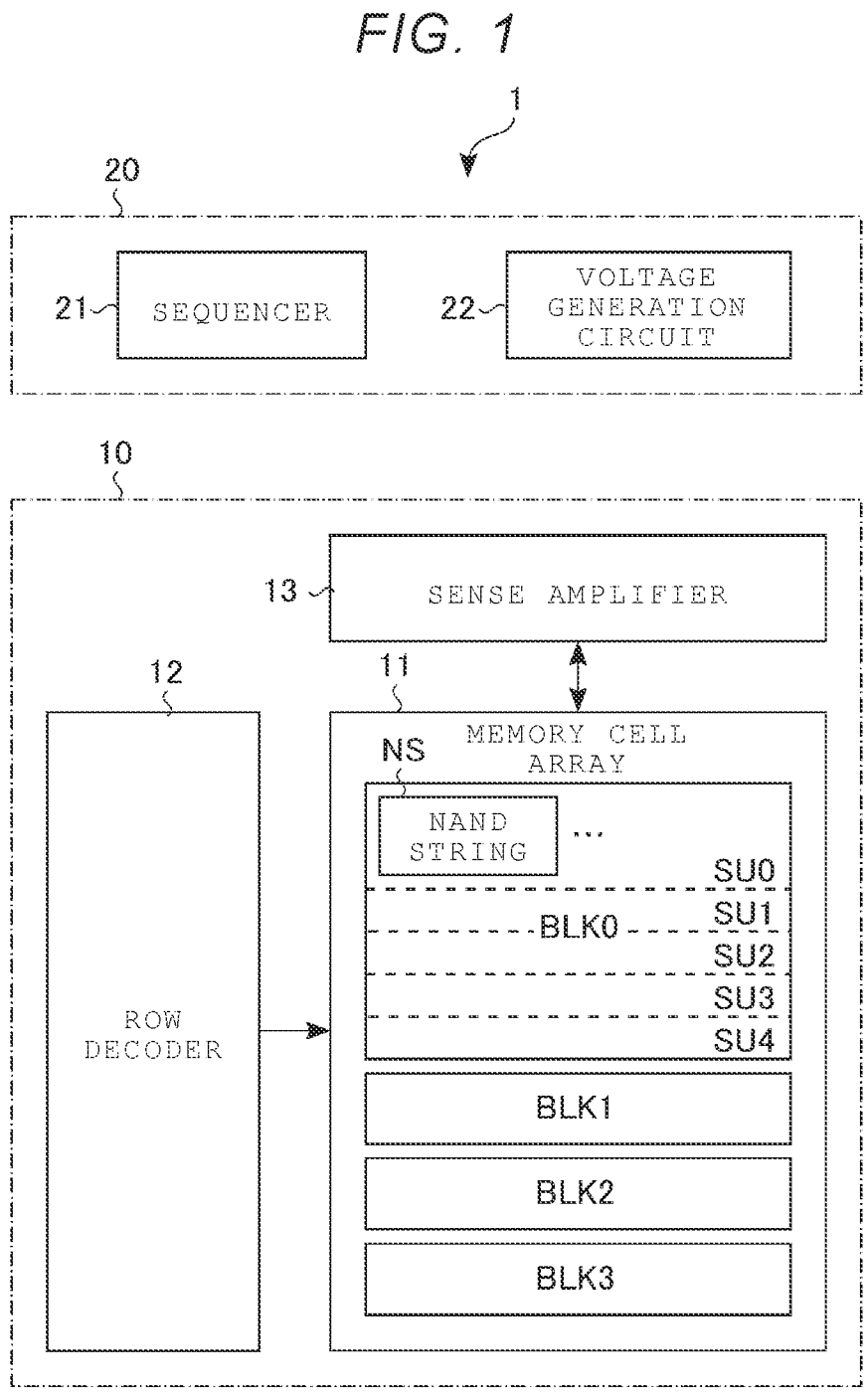
FIG. 1 is a block diagram of a semiconductor memory device according to a first embodiment.

1.1 Configuration 1.1.1 Overall Configuration of Semiconductor Memory Device First, an example of the overall configuration of the semiconductor memory device 1 will be described with reference to FIG. 1. FIG. 1 is a block diagram illustrating the overall configuration of the semiconductor memory device 1. In FIG. 1, some connections between respective components are indicated by arrowed lines, but the connections between the components are not limited thereto.

As illustrated in FIG. 1, the semiconductor memory device 1 includes a memory core unit 10 and a peripheral circuit unit 20.

The memory core unit 10 includes a memory cell array 11, a row decoder 12, and a sense amplifier 13.

The memory cell array 11 is a region in which nonvolatile memory cell transistors are arranged three-dimensionally. The memory cell array 11 includes a plurality of blocks BLKs. In the example of FIG. 1, the memory cell array 11 includes four blocks BLK (BLK0 to BLK3). Each block BLK is a set (group) of memory cell transistors for which data can be collectively erased. A block BLK includes a plurality of memory cell transistors arranged in rows and columns. Each block BLK includes a plurality of string units SU. In the example of FIG. 1, the block BLK includes four string units SU (SU0, SU1, SU2, and SU3). A string unit SU is set of a plurality of NAND strings NS that can be collectively selected in a write operation or a read operation. A string unit SU includes the plurality of NAND strings NS. Each NAND string NS is a set of memory cell transistors connected in series. The number of blocks BLK in the memory cell array 11 and the number of string units SU in each block BLK may be freely selected.

The row decoder 12 is a circuit that decodes a row address. The row decoder 12 receives information about the row address from an external controller. The row decoder 12 selects wiring in a row direction (word line and select gate line) of the memory cell array 11 based on a decoding result of the information about the row address. The row decoder 12 supplies a voltage to the selected wiring in the row direction.

The sense amplifier 13 is a circuit for writing and reading data. The sense amplifier 13 reads data from the memory cell transistors of a block BLK when reading data. The sense amplifier 13 supplies a voltage based on write data to the memory cell array 11 when writing data.

The peripheral circuit unit 20 includes a sequencer 21 and a voltage generation circuit 22.

The sequencer 21 controls the operation of the entire semiconductor memory device 1. More specifically, the sequencer 21 controls the voltage generation circuit 22, the row decoder 12, the sense amplifier 13, and the like during write operation, read operation, and erase operation.

The voltage generation circuit 22 generates voltages used for write operations, read operations, and erase operations, and supplies the voltages to the row decoder 12, the sense amplifier 13, and the like.

1.1.2 Circuit Configuration of Memory Cell Array

Figure 2:
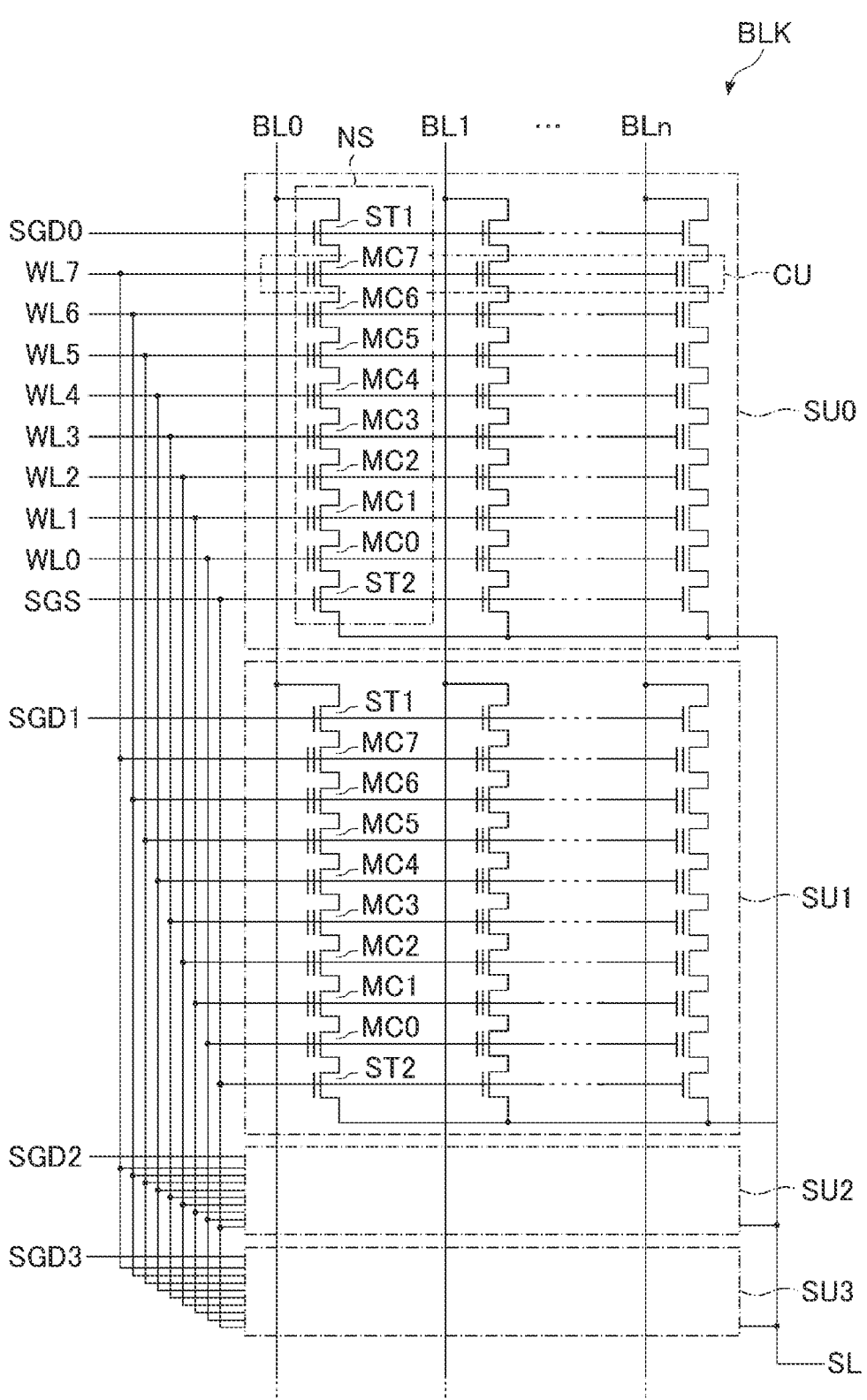
FIG. 2 is a circuit diagram of a memory cell array of a semiconductor memory device according to a first embodiment.

Next, an example of a circuit configuration of the memory cell array 11 will be described with reference to FIG. 2. FIG. 2 is a circuit diagram of the memory cell array 11.

As illustrated in FIG. 2, each block BLK includes, for example, four string units SU0 to SU3. The plurality of NAND strings NS in the string unit SU are connected to any one of a plurality of bit lines BL. In the example of FIG. 2, the string unit SU includes (n+1) NAND strings NS. The (n+1) NAND strings NS are respectively connected to (n+1) bit lines BL0 to BLn (n is an integer equal to or greater than 1).

Each NAND string NS includes a plurality of memory cell transistors MC and select transistors ST1 and ST2. In the example of FIG. 2, the NAND string NS includes eight memory cell transistors MC0 to MC7.

The memory cell transistor MC is a memory element that stores data in a nonvolatile manner. The memory cell transistor MC includes a control gate and a charge storage layer. The memory cell transistor MC may be a metal-oxide-nitride-oxide-silicon (MONOS) type using an insulator for the charge storage layer or may be a floating gate (FG) type using a conductor for the charge storage layer. A case where the memory cell transistor MC is the MONOS type will be described below.

The select transistors ST1 and ST2 are switching elements. The select transistors ST1 and ST2 are used for selecting the string unit SU during various operations.

The current paths of the select transistor ST2, the memory cell transistors MC0 to MC7, and the select transistor ST1 in the NAND string NS are connected in series. A drain of the select transistor ST1 is connected to the bit line BL. A source of the select transistor ST2 is connected to a source line SL.

Control gates of the memory cell transistors MC0 to MC7 in the same block BLK are connected in common to word lines WL0 to WL7, respectively. More specifically, for example, the block BLK includes four string units SU0 to SU3. Each string unit SU includes a plurality of memory cell transistors MC0. The control gates of the plurality of memory cell transistors MC0 in the block BLK are commonly connected to one word line WL0. The same applies to the memory cell transistors MC1 to MC7.

Gates of the plurality of select transistors ST1 in the string unit SU are connected in common to one select gate line SGD. More specifically, gates of the plurality of select transistors ST1 in the string unit SU0 are connected to a select gate line SGD0. Gates of the plurality of select transistors ST1 in the string unit SU1 are connected to a select gate line SGD1. Gates of the plurality of select transistors ST1 in the string unit SU2 are connected to a select gate line SGD2. Gates of the plurality of select transistors ST1 in the string unit SU3 are connected to a select gate line SGD3.

Gates of the plurality of select transistors ST2 in the block BLK are connected to a select gate line SGS. Similar to the select gate line SGD, the select gate line SGS may be provided for each string unit SU in some examples.

The word lines WL0 to WL7, the select gate lines SGD0 to SGD3, and the select gate line SGS are connected to the row decoder 12.

Each bit line BL is connected to one NAND string NS in each of the plurality of string units SU in each block BLK. Each bit line BL is connected to the sense amplifier 13.

The source line SL can be shared among the plurality of blocks BLK.

A group of memory cell transistors MC connected to the same word line WL in one string unit SU can be referred to as a "cell unit CU". That is, the cell unit CU is a set of memory cell transistors MC collectively selected in write operation or read operation. A page is a unit of data that can be written simultaneously into (or collectively read from) the cell unit CU. When the memory cell transistor MC stores 1-bit data, a storage capacity of the cell unit CU is one page. However, a cell unit CU can have a storage capacity of two pages or more based on the number of bits of data that can be stored by each memory cell transistor MC.

1.1.3 Configuration of Memory Cell Array in Plan View

Figure 3:
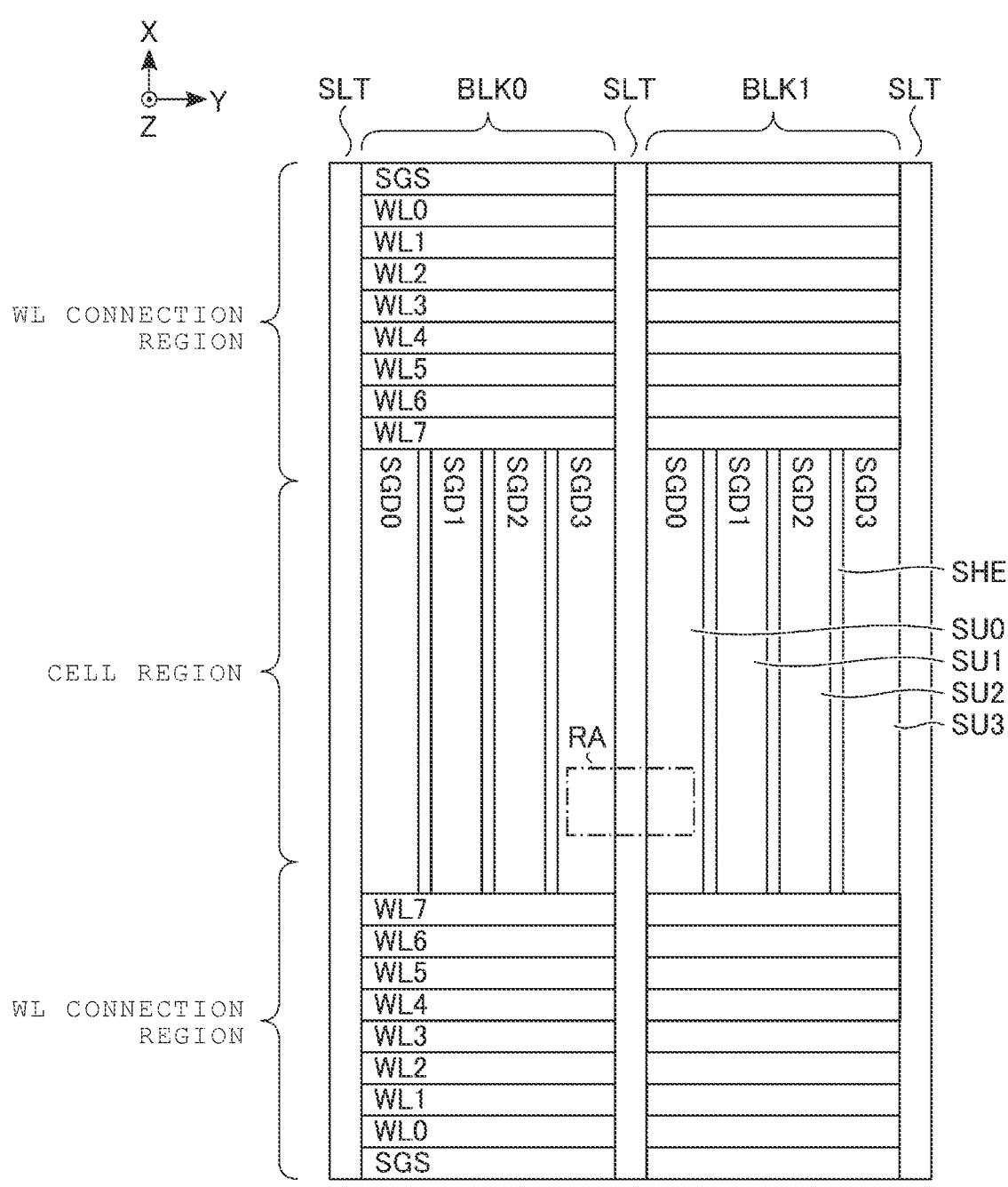
FIG. 3 is a plan view of certain blocks of a memory cell array of a semiconductor memory device according to a first embodiment.
Figure 4:
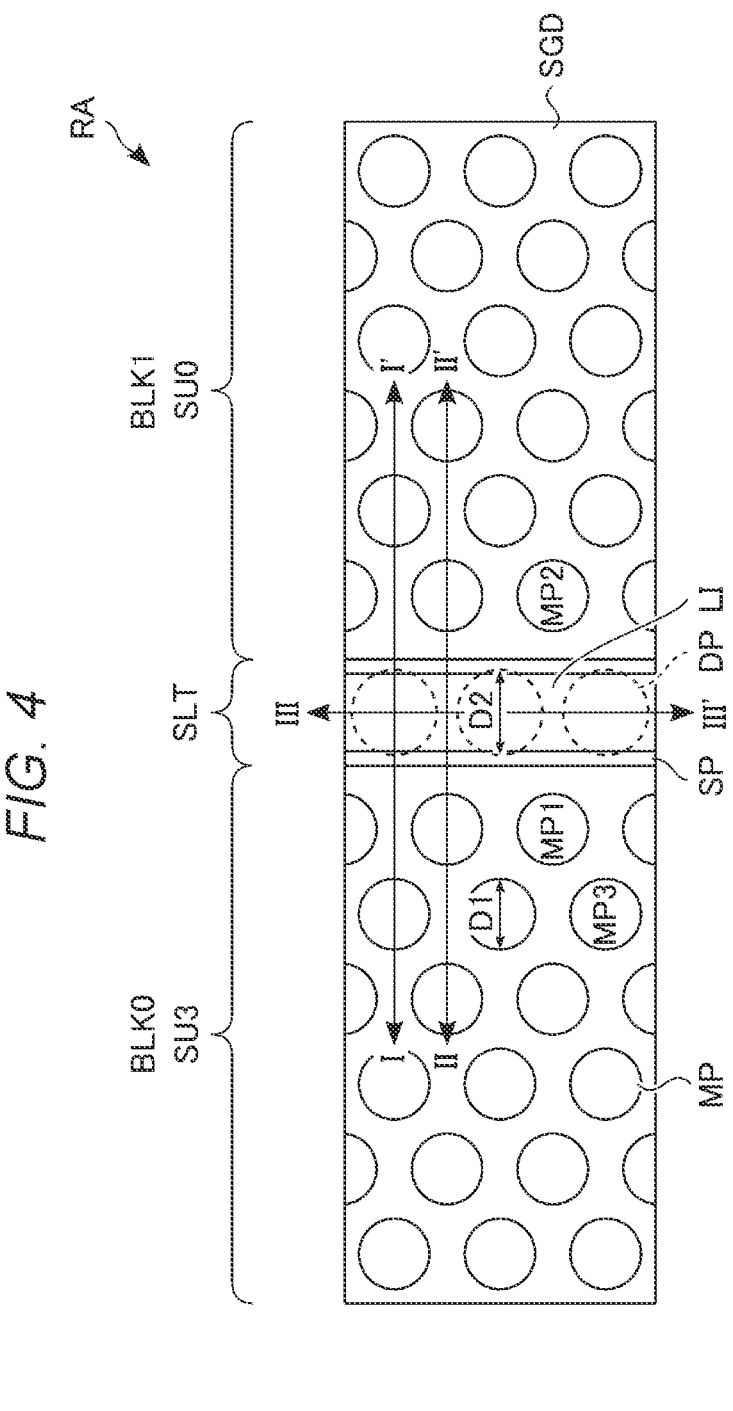
FIG. 4 is an enlarged view of a region in FIG. 3.

Next, an example of a configuration of the memory cell array 11 in plan view will be described with reference to FIGS. 3 and 4. FIG. 3 is a plan view of the blocks BLK0 and BLK1 of the memory cell array 11. FIG. 4 is an enlarged view of a region RA in FIG. 3. The examples of FIGS. 3 and 4 illustrate an upper surface of a wiring layer functioning as the select gate line SGD. In the examples of FIGS. 3 and 4, an interlayer insulating film is omitted from the depiction. In the following description, a surface facing to the semiconductor substrate side may be referred to as a "bottom surface". A surface opposite to the bottom surface facing away from the semiconductor substrate may be referred to as an "upper surface". Similarly, upper and lower directionality may be used for convenience in describing the drawings.

As illustrated in FIG. 3, the memory cell array 11 includes a cell region and WL connection regions. The cell region is a region in which the memory cell transistors MC are located. Each WL connection region is a connection region between the word line WL and the select gate lines SGD and SGS and a contact plug. Each of the word line WL and the select gate lines SGD and SGS is connected to the row decoder 12 via the contact plug provided in the WL connection region. The memory cell transistors MC are not located in the WL connection region. In the example of FIG. 3, the cell region is disposed in the central portion in the X-direction. The WL regions are disposed at two end portions in the X-direction. The disposition of the cell region and the WL connection regions can be freely selected. For example, the WL connection regions may be provided in the central portion in the X-direction.

The memory cell array 11 includes a plurality of members SLT. The members SLT extend in the X-direction. The plurality of members SLT are spaced from each other in the Y-direction. The members SLT separate a plurality of wiring layers for each block BLK. The individual blocks BLK are located between otherwise adjacent members SLT in the Y-direction. In the example of FIG. 3, the two blocks BLK0 and BLK1 are disposed between three members SLT in the Y-direction. Respective blocks BLK can be located next to each other in the Y-direction with a member SLT interposed between the otherwise adjacent blocks BLK.

Each block BLK is provided with the plurality of wiring layers. The plurality of wiring layers are spaced apart from each other and stacked in the Z-direction. In the example of FIG. 3, ten layers of wiring layers respectively functioning as the select gate line SGS, the word lines WL0 to WL7, and the select gate line SGD are stacked in order from the lower layer. For example, the ten layers of wiring layers are drawn out stepwise in the X-direction in the WL connection region. Hereinafter, in the WL connection region, a region drawn out stepwise is referred to as a "terrace". The contact plug is provided on the terrace of each wiring layer. In the WL connection region, each wiring layer may not be drawn out stepwise.

Each block BLK is provided with a plurality of members SHE. Each member SHE extends in the X-direction. The plurality of members SHE are spaced from each other in the Y-direction. The member SHE contains an insulating material. For example, the member SHE contains silicon oxide (SiO) as an insulating material. The member SHE separates the wiring layer(s) functioning as the select gate line SGD for each string unit SU. In the example of FIG. 3, three members SHE are provided in a block BLK. Therefore, the wiring layer functioning as the select gate line SGD is separated into four different portions in the Y-direction. For example, different wiring layer portions separated in a block BLK function respectively as select gate lines SGD0, SGD1, SGD2, and SGD3. That is, the string units SU0, SU1, SU2, and SU3 are provided in order from the left side of the paper surface.

Next, the configuration of the cell region and the member SLT will be described. FIG. 4 illustrates the string unit SU3 of the block BLK0, the string unit SU0 of the block BLK1, and the member SLT provided between the string units SU3 and SU0 of these different blocks.

As illustrated in FIG. 4, the cell region is provided with a plurality of memory pillars MP. One memory pillar MP corresponds to one NAND string NS. For example, the memory pillar MP has a cylindrical shape extending in the Z-direction. The memory pillar MP penetrates through (passes through) a plurality of wiring layers stacked in the Z-direction. In the example illustrated in FIG. 4, a plurality of memory pillars MP in each block BLK are located in a staggered arrangement in six rows in the X-direction. The arrangement of the memory pillars MP can be freely designed.

The member SLT can include a contact plug LI and a spacer SP. The contact plug LI has, for example, a line shape extending in the X-direction. The contact plug LI is used for connecting the source line SL and the wiring provided above the memory cell array 11. The bottom surface of the contact plug LI is in contact with the wiring layer functioning as the source line SL. The contact plug LI is made of a conductive material. For example, the contact plug LI comprises tungsten. The spacer SP is provided on side surfaces of the contact plug LI. That is, the contact plug LI is surrounded by the spacer SP in plan view on the XY plane. The spacer SP separates and insulates the contact plug LI from the blocks BLK adjacent to the contact plug LI in the Y-direction. The spacer SP is made of an insulating material. For example, the spacer SP comprises silicon oxide as an insulating material. In some examples, a member SLT may not include a contact plug LI.

The member SLT of the first embodiment includes a plurality of dummy pillars DP. Each dummy pillar DP has a cylindrical shape extending in the Z-direction. For example, the plurality of dummy pillars DP are spaced apart from each other in the X-direction and arranged in a line. Each dummy pillar DP is in contact with the bottom surfaces of the contact plug LI and the spacer SP. In other words, the dummy pillars DP are disposed below the contact plug LI and the spacer SP.

The dummy pillars DP are used to reduce variations in pattern density of the memory pillars MP ("memory holes") in an end portion of the block BLK as compared to a central portion of the block BLK in the Y-direction when holes ("memory holes") corresponding to the memory pillars MP are formed in manufacturing. The holes ("dummy holes") corresponding to the dummy pillars DP are processed at the same time as when the memory holes are processed. For example, a distance between two memory pillars MP1 and MP2 disposed on opposite sides of the member SLT will be larger than a distance between the memory pillars MP1 and MP3. Therefore, in a lithography process and an etching process for forming the memory holes, the maximum diameter ("long diameter") of the memory pillars MP1 and MP2 in edge/end regions in the XY plane may differ from the long diameter of the memory pillar MP3 disposed in the central portion (middle) of the block BLK. The depth of the memory holes may also be different for the memory pillars MP1 and MP2 and the memory pillar MP3. Because of the dummy pillars DP (dummy holes), the difference in density of the pattern at near the member SLT is reduced, and thus variations in the shape of the memory pillars MP at the end portions of the block BLK and the memory pillars MP at the central portion of the block BLK is reduced.

The long diameters of the memory pillar MP and the dummy pillar DP in the same layer (semiconductor layer functioning as source line SL) can be set to D1 and D2, respectively, such that the long diameter D1 and the long diameter D2 have a relationship of long diameter D1<long diameter D2.

1.1.4 Configuration of Cross Section of Memory Cell Array

Figure 5:
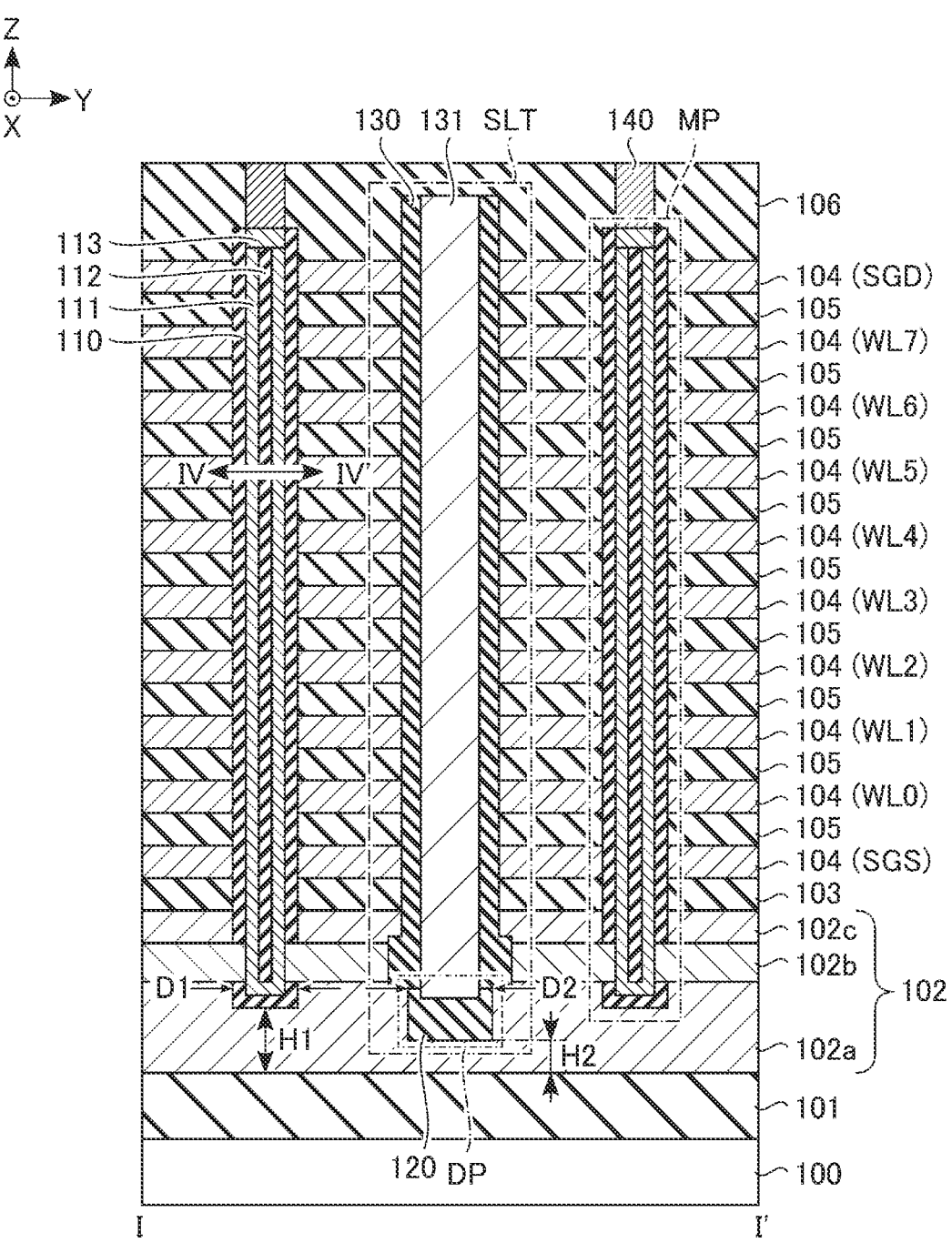
FIG. 5 is a cross-sectional view taken along line I-I' of FIG. 4.
Figure 6:
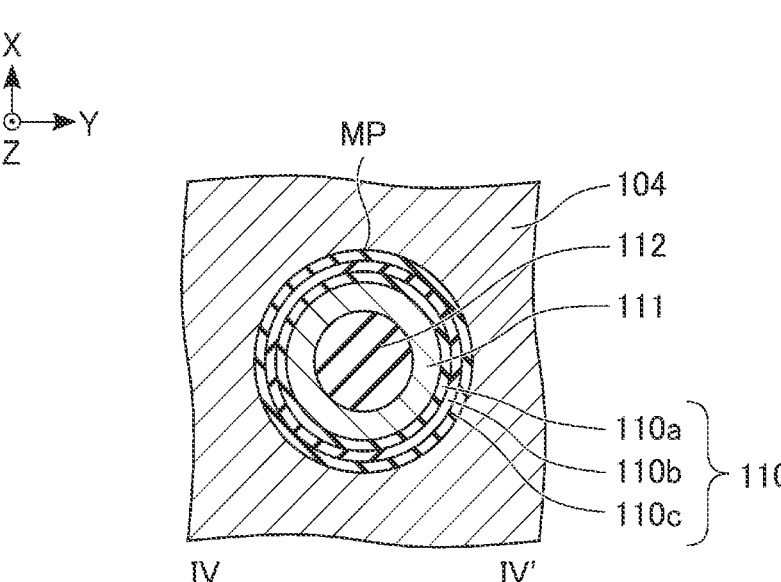
FIG. 6 is a cross-sectional view taken along line IV-IV' in FIG. 5.
Figure 7:
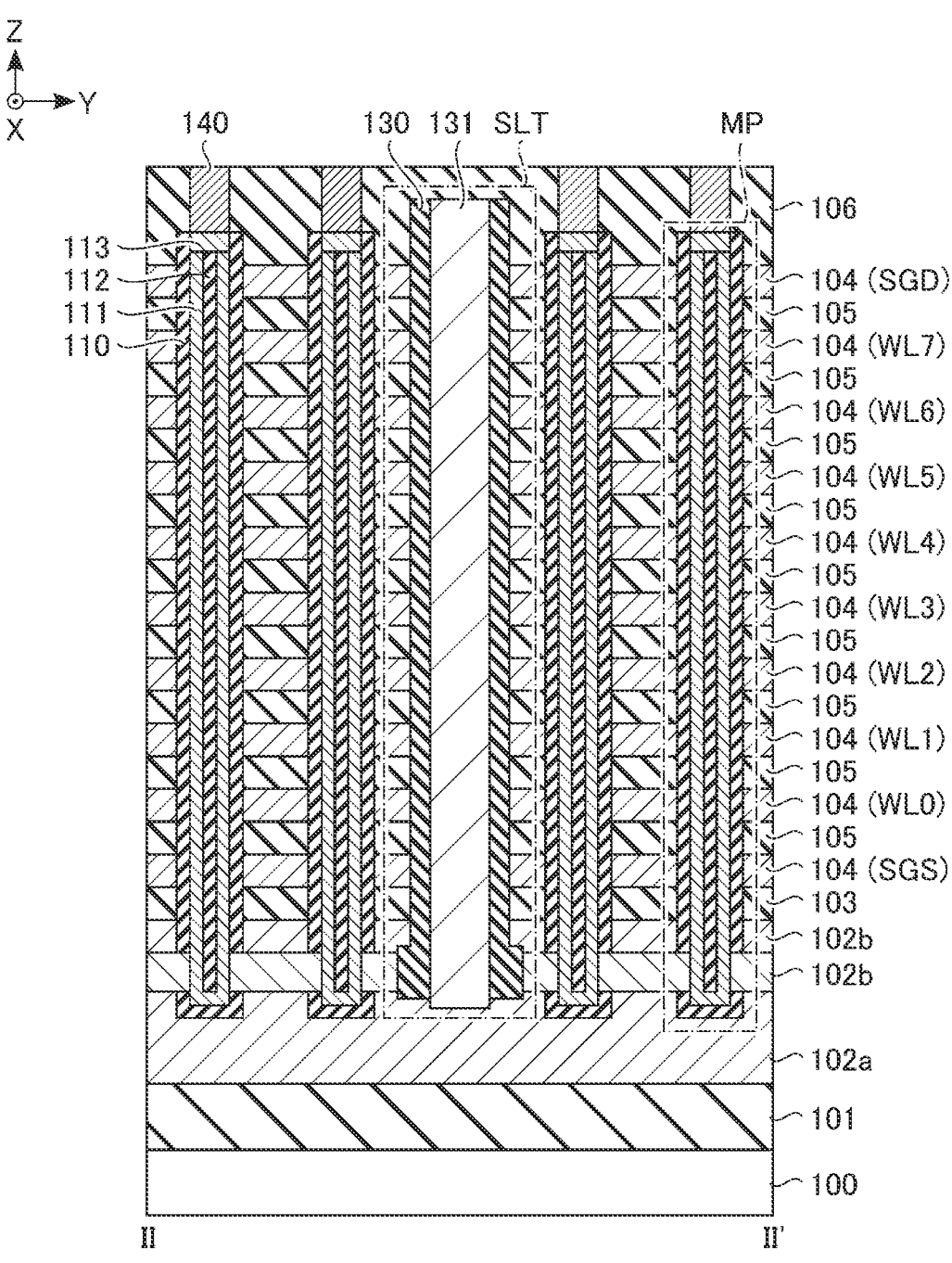
FIG. 7 is a cross-sectional view taken along line II-II' of FIG. 4.
Figure 8:
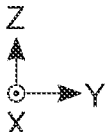
FIG. 8 is a cross-sectional view taken along line III-III' of FIG. 4.
Figure 8:
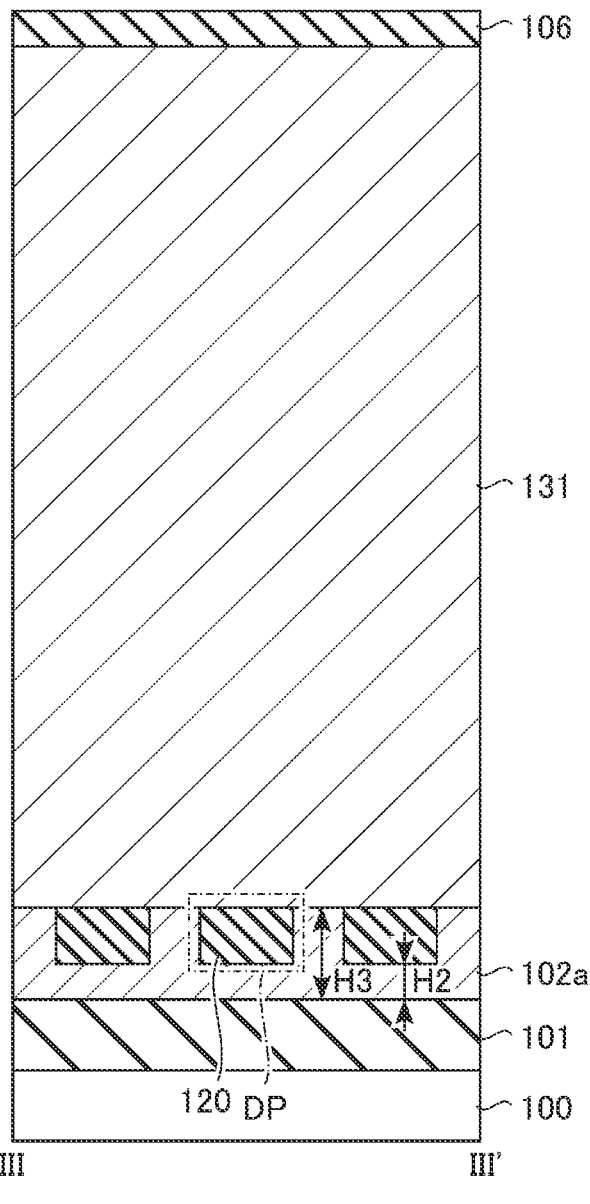

Next, an example of the configuration of cross section of the memory cell array 11 will be described with reference to FIGS. 5 to 8. FIG. 5 is a cross-sectional view taken along line I-I' of FIG. 4. FIG. 6 is a cross-sectional view taken along IV-IV' of FIG. 5. FIG. 7 is a cross-sectional view taken along line II-II' of FIG. 4. FIG. 8 is a cross-sectional view taken along line of FIG. 4.

As illustrated in FIG. 5, an insulating layer 101 is provided on a semiconductor substrate 100. For example, the insulating layer 101 comprises silicon oxide. A circuit such as the row decoder 12 or the sense amplifier 13 may be provided in a region where the insulating layer 101 is provided, that is, between the semiconductor substrate 100 and a semiconductor layer 102.

The semiconductor layer 102 functioning as the source line SL is provided on the insulating layer 101. The semiconductor layer 102 extends in the X and Y directions. The semiconductor layer 102 comprises, for example, three semiconductor layers 102a, 102b, and 102c. The semiconductor layer 102a is provided on the insulating layer 101. The semiconductor layer 102b is provided on the semiconductor layer 102a. The semiconductor layer 102c is provided on the semiconductor layer 102b. The semiconductor layer 102b is formed, for example, by replacing an insulating layer provided between the semiconductor layers 102a and 102*c*. The semiconductor layers 102*a*, 102*b*, and 102*c* comprise, for example, silicon. The semiconductor layers 102*a* to 102*c* contain, for example, phosphorus (P) as n-type semiconductor dopant.

An insulating layer 103 is provided on the semiconductor layer 102. For example, the insulating layer 103 comprises silicon oxide.

On the insulating layer 103, ten wiring layers 104 and nine insulating layers 105 are alternately stacked one by one. For example, individual wiring layers 104 function as the select gate line SGS, the word lines WL0 to WL7, and the select gate line SGD from the lower layer. In some examples, a plurality of wiring layers 104 functioning as the select gate line SGS and a plurality of wiring layers 104 functioning as the select gate line SGD may be provided. A conductive material of the wiring layers 104 can be a stacked structure of titanium nitride (TiN)/tungsten (W). Here, titanium nitride covers tungsten and acts as a barrier layer for preventing oxidation of tungsten or as an adhesive layer for improving adhesion when a tungsten film is formed by chemical vapor deposition (CVD), for example. Each wiring layer 104 may contain a high dielectric constant material such as aluminum oxide (AlO). In such a case, the high dielectric constant material covers the conductive material. For example, for each wiring layer 104, the high dielectric constant material is in contact with insulating layers provided above and below the wiring layer 104 and the side surfaces of the memory pillars MP. Titanium nitride is in contact with the high dielectric constant material. Tungsten is in contact with titanium nitride and fills the inside of the wiring layer 104. For example, when aluminum oxide is provided as the high dielectric constant material, the memory cell transistor MC can be referred to as a metal-aluminum-nitride-oxide-silicon (MANOS) type.

An insulating layer 106 is provided on the uppermost wiring layer 104, that is, the wiring layer 104 functioning as the select gate line SGD. For example, the insulating layer 106 comprises silicon oxide.

In the cell region of the memory cell array 11, a plurality of memory pillars MP are provided. For example, each memory pillar MP has a substantially cylindrical shape extending in the Z-direction. The memory pillar MP penetrates through the ten layers of wiring layers 104. The bottom surface of the memory pillar MP reaches the inside of the semiconductor layer 102*a*. The memory pillar MP may have a structure in which a plurality of pillars are connected in the Z-direction.

Next, an internal configuration of the memory pillar MP will be described. The memory pillar MP includes a stacked body 110, a semiconductor layer 111, a core layer 112, and a cap film 113. The stacked body 110 has a configuration in which a block insulating film, a charge storage layer, and a tunnel insulating film are stacked in order from the outside of the memory pillar MP. The stacked body 110 is provided on a part of the side surface and the bottom surface of the memory pillar MP. More specifically, the stacked body 110 on the side surface of the memory pillar MP is removed in the same layer as the semiconductor layer 102*b* and in the vicinity of the semiconductor layer 102*b*. The semiconductor layer 111 is in contact with the side surfaces and bottom surface of the stacked body 110 and the semiconductor layer 102*b*. The semiconductor layer 111 is a region where channels of the memory cell transistor MC and the select transistors ST1 and ST2 are formed. The inside of the semiconductor layer 111 is filled by the core layer 112. The cap film 113 is provided on the upper ends of the semiconductor layer 111 and the core layer 112 on the upper portion of the memory pillar MP. The side surfaces of the cap film 113 are in contact with the stacked body 110. For example, the semiconductor layer 111 and the cap film 113 contain silicon. For example, the core layer 112 comprises silicon oxide. A conductor 140 is provided on the cap film 113. The conductor 140 is electrically connected to a wiring layer that functions as a bit line BL. For example, the conductor 140 comprises tungsten or copper (Cu).

Referring to FIG. 6, an example of a cross-sectional structure along the XY plane of the memory pillar MP is illustrated. FIG. 6 illustrates a cross-sectional structure of the memory pillar MP in the layers including the wiring layer 104.

As illustrated in FIG. 6, in a cross section including the wiring layer 104, the core layer 112 is provided, for example, in the central portion of the memory pillar MP. The semiconductor layer 111 surrounds side surfaces of the core layer 112. The stacked body 110 surrounds the semiconductor layer 111. More specifically, the stacked body 110 includes a tunnel insulating film 110*a*, a charge storage layer 110*b*, and a block insulating film 110*c*. The tunnel insulating film 110*a* surrounds side surfaces of the semiconductor layer 111. The charge storage layer 110*b* surrounds side surfaces of the tunnel insulating film 110*a*. The block insulating film 110*c* surrounds side surfaces of the charge storage layer 110*b*. The wiring layer 104 surrounds side surfaces of the block insulating film 110*c*.

For example, each of the tunnel insulating film 110*a* and the block insulating film 110*c* comprises silicon oxide. The charge storage layer 110*b* has a function of storing charges. For example, the charge storage layer 110*b* is silicon nitride.

As illustrated in FIG. 5, the memory cell transistors MC0 to MC7 are formed by the intersection of the memory pillar MP and the wiring layers 104 functioning as the word lines WL0 to WL7. Similarly, the select transistor ST1 is formed at the intersection of the memory pillar MP and the wiring layer 104 functioning as the select gate line SGD. The select transistor ST2 is formed at the intersection of the memory pillar MP and the wiring layer 104 functioning as the select gate line SGS. Therefore, each memory pillar MP can function as one NAND string NS.

The member SLT extends in the X- and Z-directions. The member SLT penetrates through (passes through) the wiring layers 104 and the insulating layers 103 and 105. The lower end of the member SLT reaches the inside of the semiconductor layer 102*a*. An insulator 130 surrounds side surfaces of the member SLT. The insulator 130 functions as the spacer SP. The insulator 130 can have a shape protruding outside the member SLT in the same layer as the semiconductor layer 102*b* and in the vicinity of the semiconductor layer 102*b*. For example, the insulator 130 comprises silicon oxide.

A conductor 131 can be provided in the member SLT. The conductor 131 functions as the contact plug LI. Side surfaces of the conductor 131 are in contact with the insulator 130.

As illustrated in FIGS. 7 and 8, a part of the bottom surface of the conductor 131 is in contact with the semiconductor layer 102*a*.

As illustrated in FIGS. 5 and 8, a plurality of insulators 120 are provided at the lower end of the member SLT. The insulators 120 correspond to the dummy pillars DP. For example, the insulator 120 comprises silicon oxide. For example, the insulator 130 and the insulator 120 can be made of the same material.

As illustrated in FIG. 5, the upper surface of the insulator 120 is in contact with the insulator 130 and the conductor 131. The insulator 120 disposed below the insulator 130 and the conductor 131 is a remaining portion of the dummy pillar DP partially removed in the manufacturing process of the spacer SP and the contact plug LI.

The long diameter of the upper surface of the insulator 120 can be set to D2. The long diameter of the memory pillar MP at the same height as the upper surface of the insulator 120 can be set to D1. The long diameter D1 and the long diameter D2 have a relationship of long diameter D1<long diameter D1, such as described with reference to FIG. 4.

For example, the height (distance) from the bottom surface (surface facing the semiconductor substrate 100) of the semiconductor layer 102a to the stacked body 110 of the memory pillar MP is set to H1. The height (distance) from the bottom surface of the semiconductor layer 102a to the insulator 120 is set to H2. The height H1 and the height H2 have a relationship of H1>H2. That is, the distance H2 is less than the distance H1.

As illustrated in FIG. 8, the height from the bottom surface of the semiconductor layer 102a to the conductor 131 is set to H3. The height H2 and the height H3 have a relationship of H2<H3.

The bottom surface of the insulator 120 may reach the insulating layer 101. That is, the dummy pillar DP may penetrate through (pass through) the semiconductor layer 102a.

1.2 Method of Manufacturing Memory Cell Array

Next, an example of a method of manufacturing the memory cell array 11 will be described with reference to FIGS. 9 to 17. FIGS. 9 to 17 are views illustrating a shape in plan view and a cross section of the memory cell array 11 in a manufacturing process of the memory cell array 11. A method of forming the wiring layers 104 by forming a structure corresponding to the wiring layers 104 with sacrificial layers in positions for the wiring layers 104, removing the sacrificial layers, and filling the space left by removal of the sacrificial layers with a conductive material will be further described below. The process is referred to as a "replacement process" or "replacement" in some instances.

Figure 9:
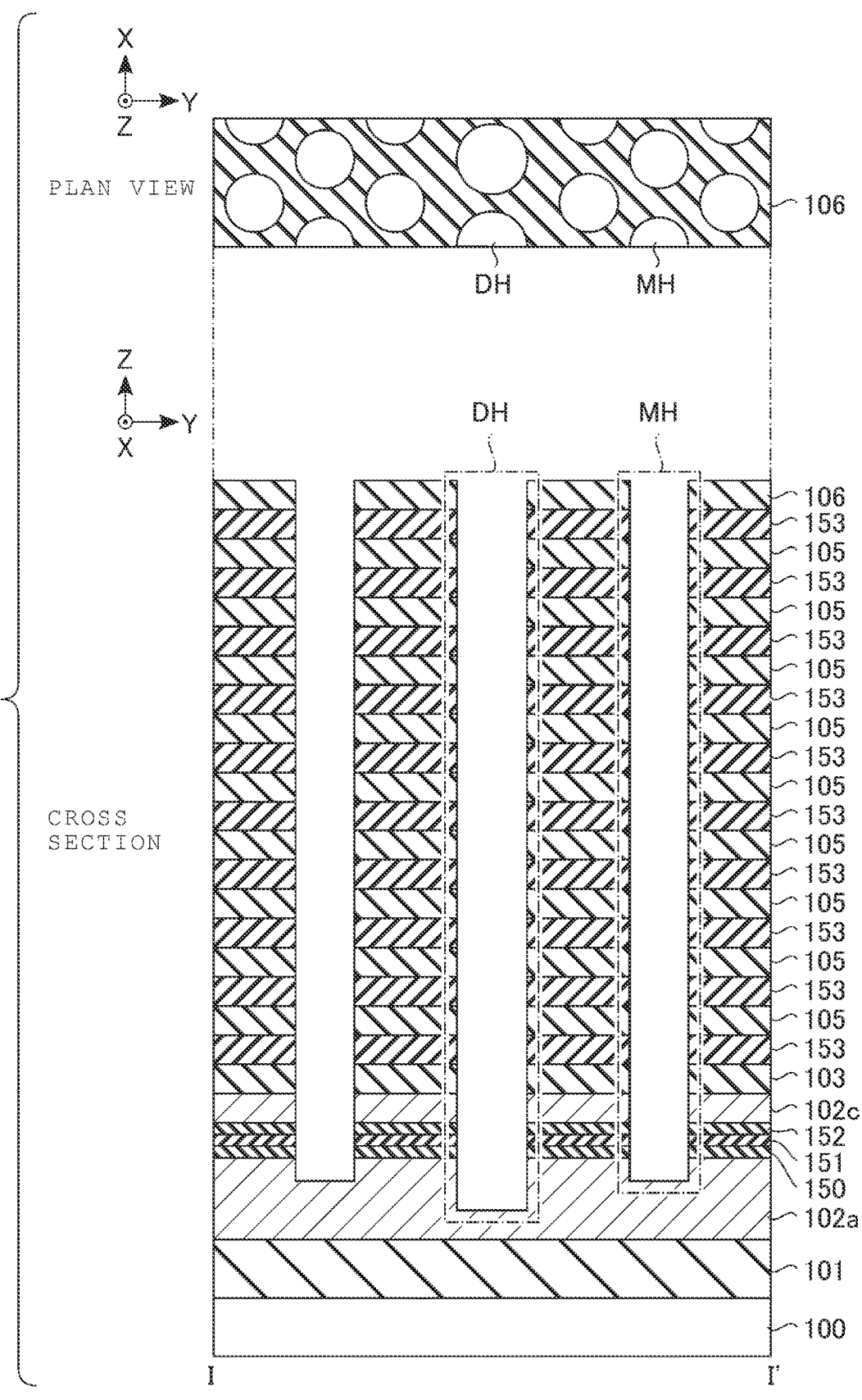
FIGS. 9 to 17 are views illustrating aspects of a manufacturing process of a memory cell array of a semiconductor memory device according to a first embodiment.

As illustrated in FIG. 9, the insulating layer 101 is formed on the semiconductor substrate 100. The semiconductor layer 102a is formed on the insulating layer 101. Insulating layers 150, 151 and 152 are sequentially formed on the semiconductor layer 102a. The insulating layers 150 to 152 will later be replaced with the semiconductor layer 102b. For example, the insulating layers 150 and 152 contain silicon oxide. For example, the insulating layer 151 comprises silicon nitride. For the insulating layer 151, a material with which a sufficient etching selectivity with respect to the insulating layers 150 and 152 can be obtained is used. That is, for the insulating layer 151, a material having film composition different from that of the insulating layers 150 and 152 is selected. The semiconductor layer 102c is formed on the insulating layer 152. The insulating layer 103 is formed on the semiconductor layer 102c. On the insulating layer 103, ten sacrificial layers 153 and nine insulating layers 105 are alternately stacked one by one. The sacrificial layers 153 are ultimately replaced with the wiring layers 104 in a later process. For example, silicon nitride is used for the sacrificial layers 153. The insulating layer 106 is formed on the uppermost sacrificial layer 153.

Next, memory holes MH and dummy holes DH are formed together. The dummy holes DH are provided in a region where the member SLT will be formed. The bottom surfaces of the memory holes MH and the dummy holes DH reach the inside of the semiconductor layer 102a. The long diameter D2 of each dummy hole DH is larger than the long diameter D1 of each memory hole MH. Therefore, a depth from the surface to the bottom of the dummy hole DH will be deeper than that of the memory hole MH. In other words, a height position of the bottom surface of the dummy hole DH in the Z-direction is lower than a height position of the bottom surface of the memory hole MH.

Figure 10:
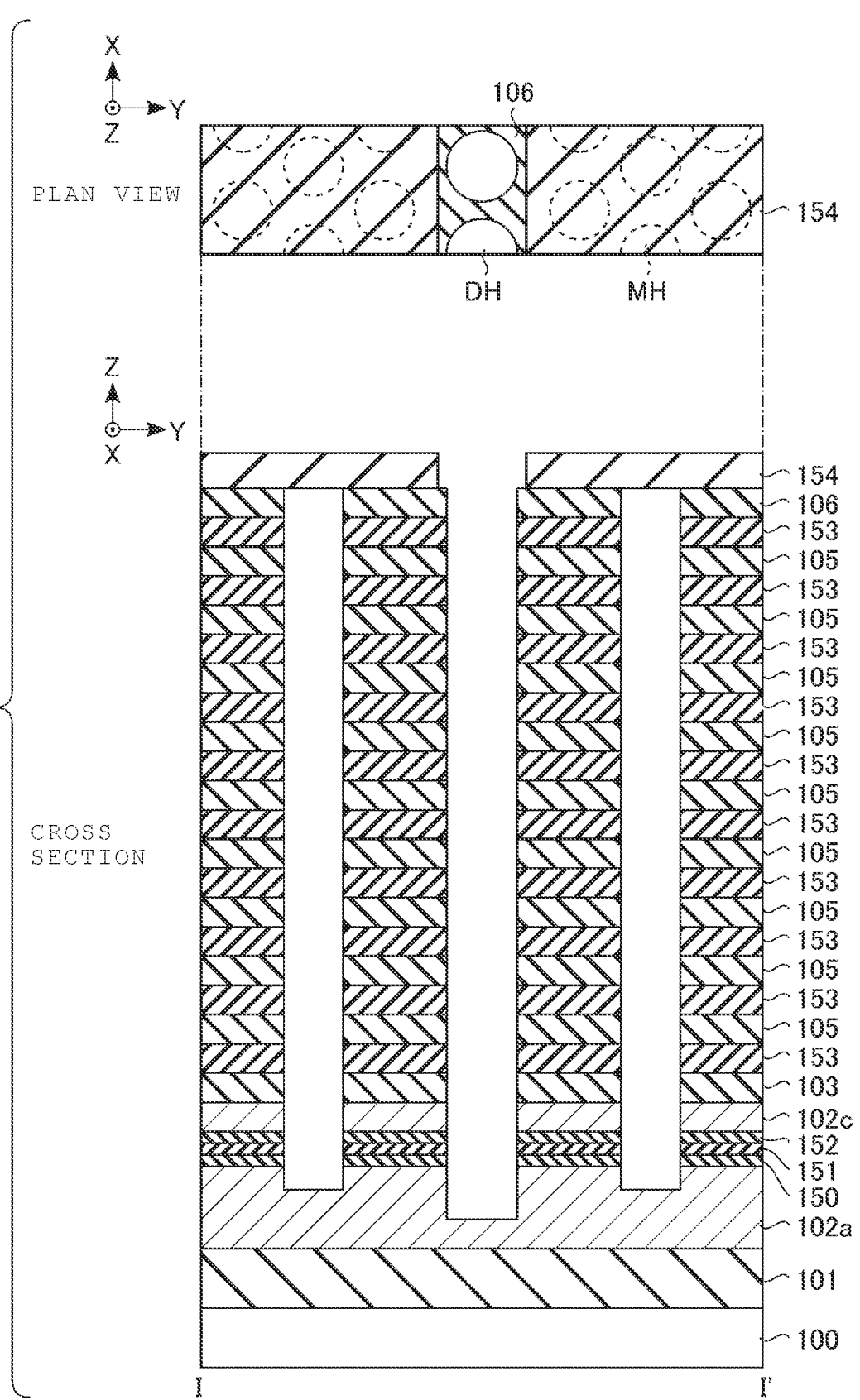

As illustrated in FIG. 10, a mask member 154 covers the memory holes MH. More specifically, the mask member 154 is formed as a film by using a film formation method such as plasma CVD that has relatively poor embedding characteristics. For example, the mask member 154 is silicon oxide. Then, the mask member 154 above the dummy holes DH is removed. The mask member 154 is not limited to an insulating material like silicon oxide. For example, a resist or the like may be used.

Figure 11:
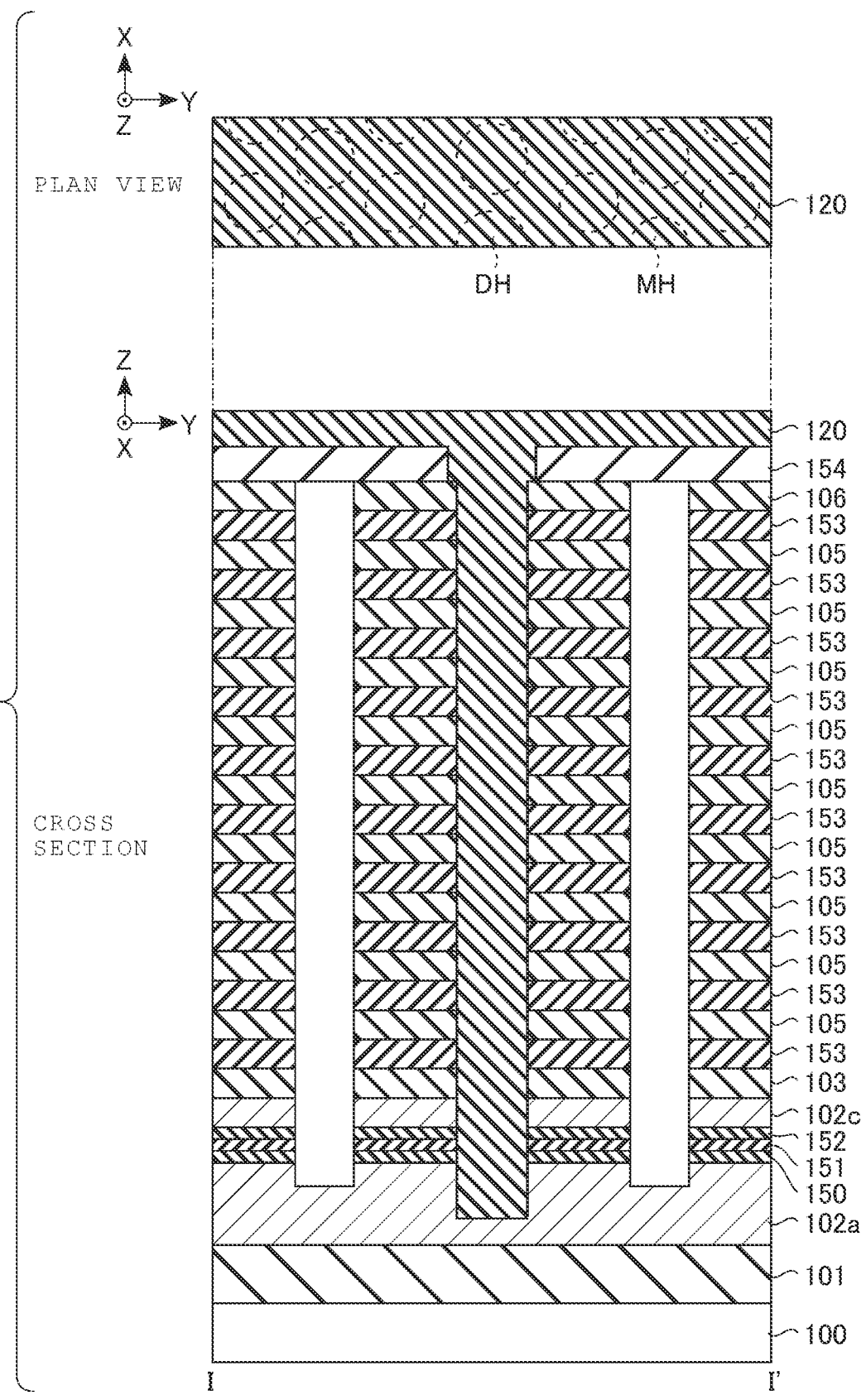

As illustrated in FIG. 11, the dummy hole DH is filled (embedded) by the insulator 120. For example, the insulator 120 may be formed using a film formation method such as atomic layer deposition (ALD), which has relatively good embedding (filling) characteristics, or may be formed using a coating method.

Figure 12:
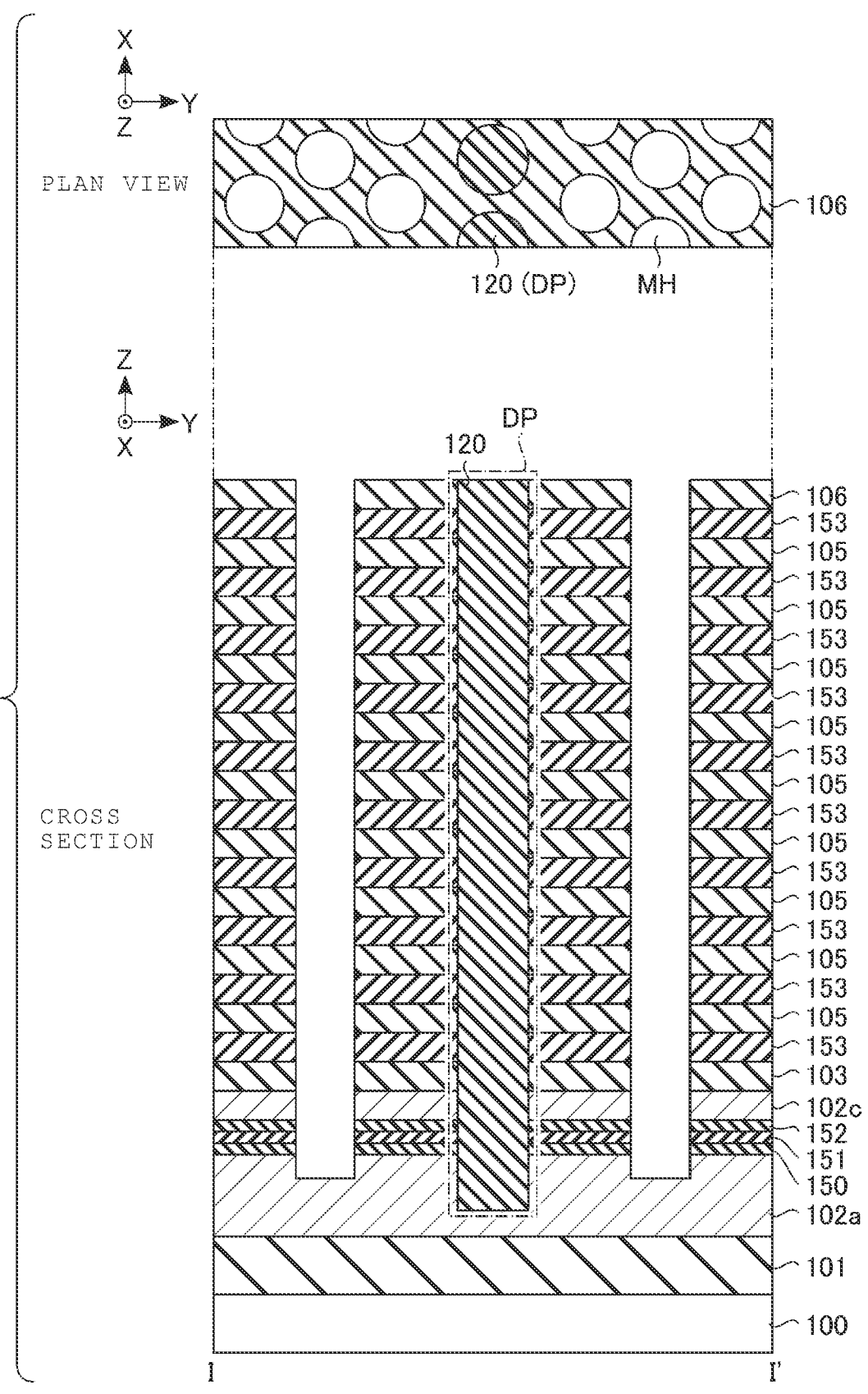

As illustrated in FIG. 12, the mask member 154 and the insulator 120 on the insulating layer 106 are removed. Therefore, the memory hole MH is opened. The insulator 120 forms the dummy pillar DP. The height position of the upper surface of the dummy pillar DP at the current step reaches the insulating layer 106.

Figure 13:
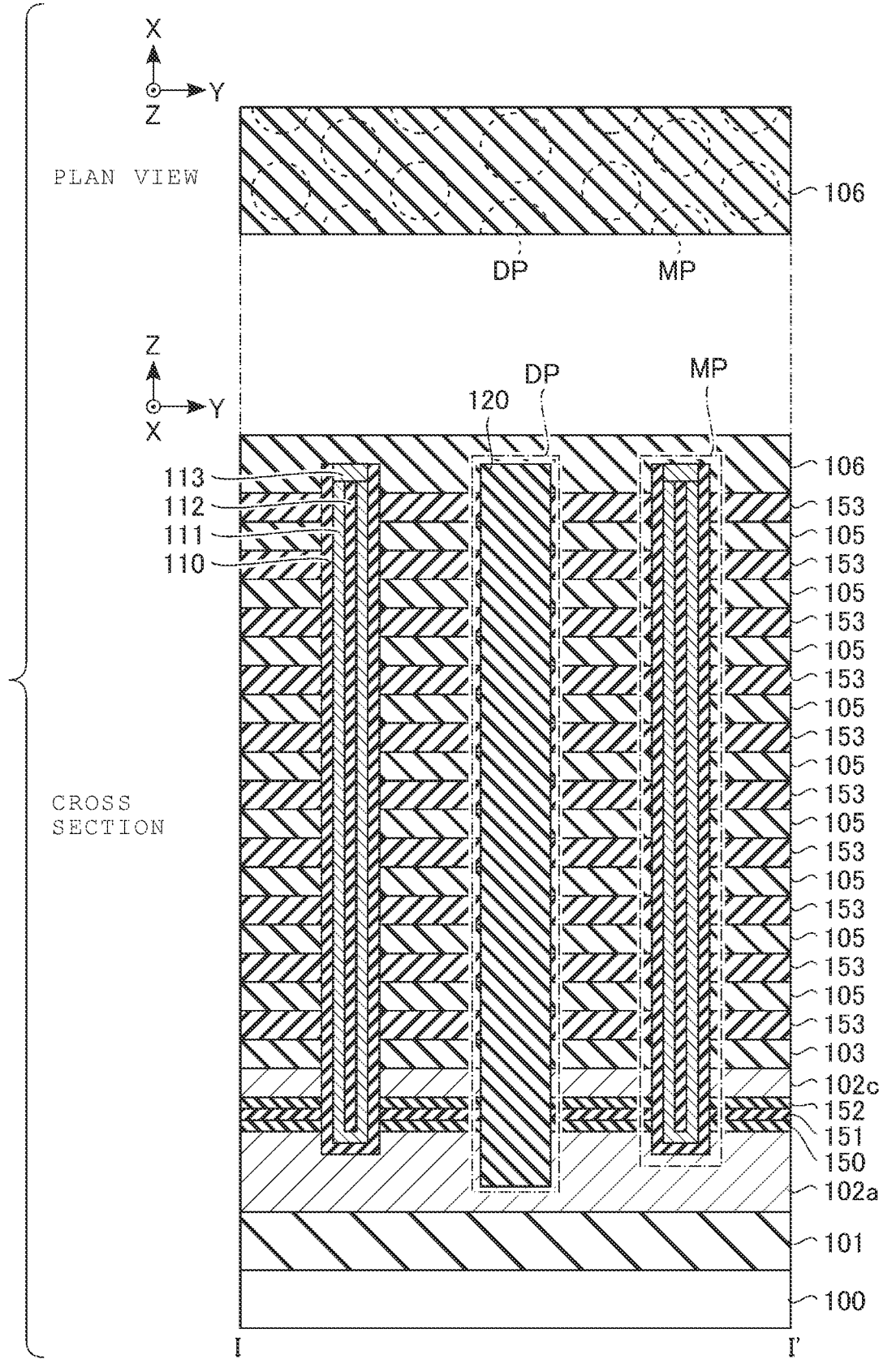

As illustrated in FIG. 13, the memory pillar MP is formed. More specifically, the stacked body 110, the semiconductor layer 111, and the core layer 112 are sequentially formed to fill the memory hole MH. Next, the semiconductor layer 111 and the core layer 112 above the memory pillar MP are removed, and the cap film 113 is formed. Next, the stacked body 110 and the cap film 113 on the insulating layer 106 are removed.

Next, the insulating layer 106 covers the memory pillar MP and the dummy pillar DP.

Figure 14:
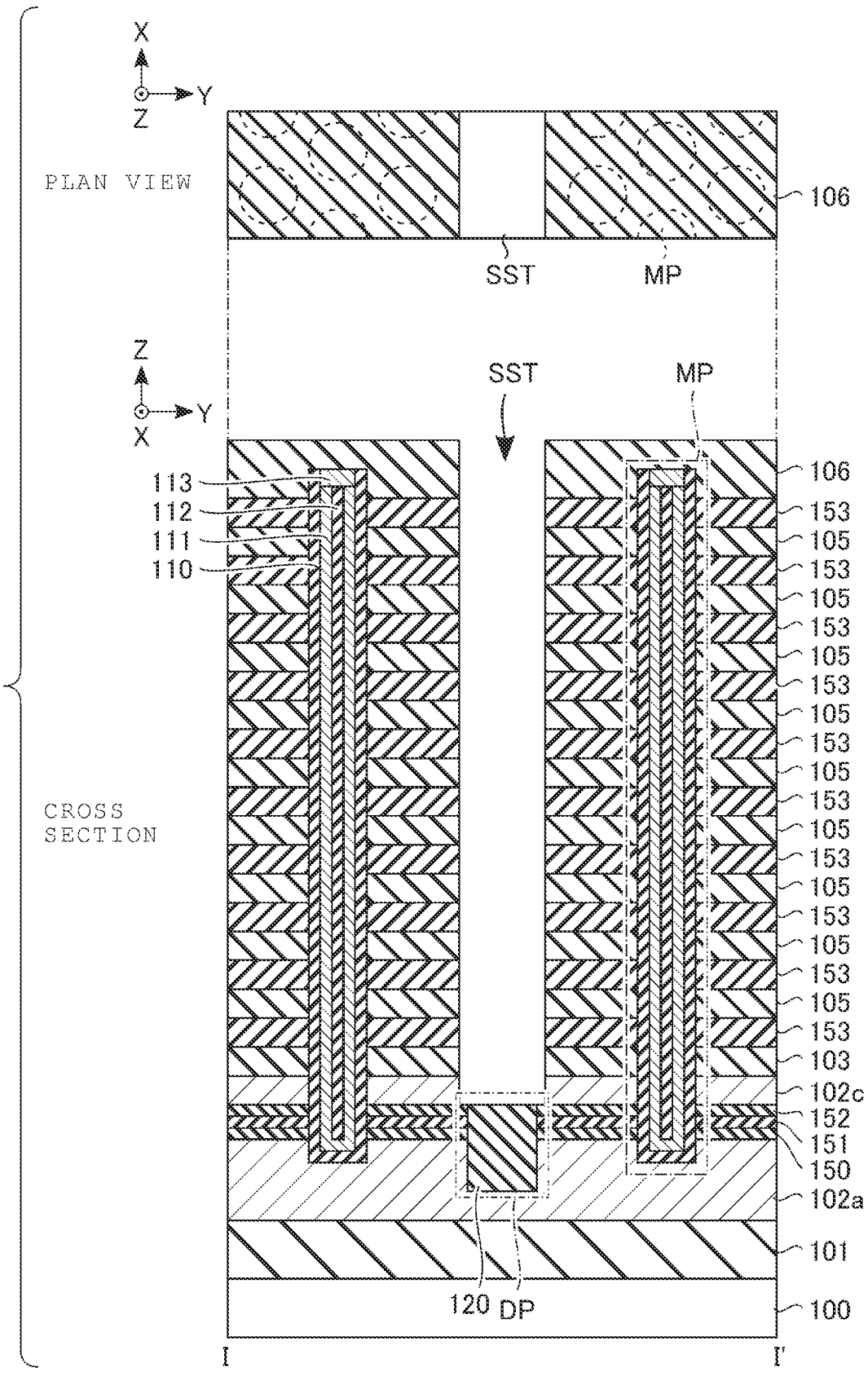

As illustrated in FIG. 14, a slit SST is formed. The slit SST corresponds to the member SLT. The slit SST extends in the X-direction. The bottom surface of the slit SST reaches the upper surface of the insulating layer 152. When processing the slit SST, the insulator 120 is also processed up to the bottom surface of the slit SST.

Figure 15:
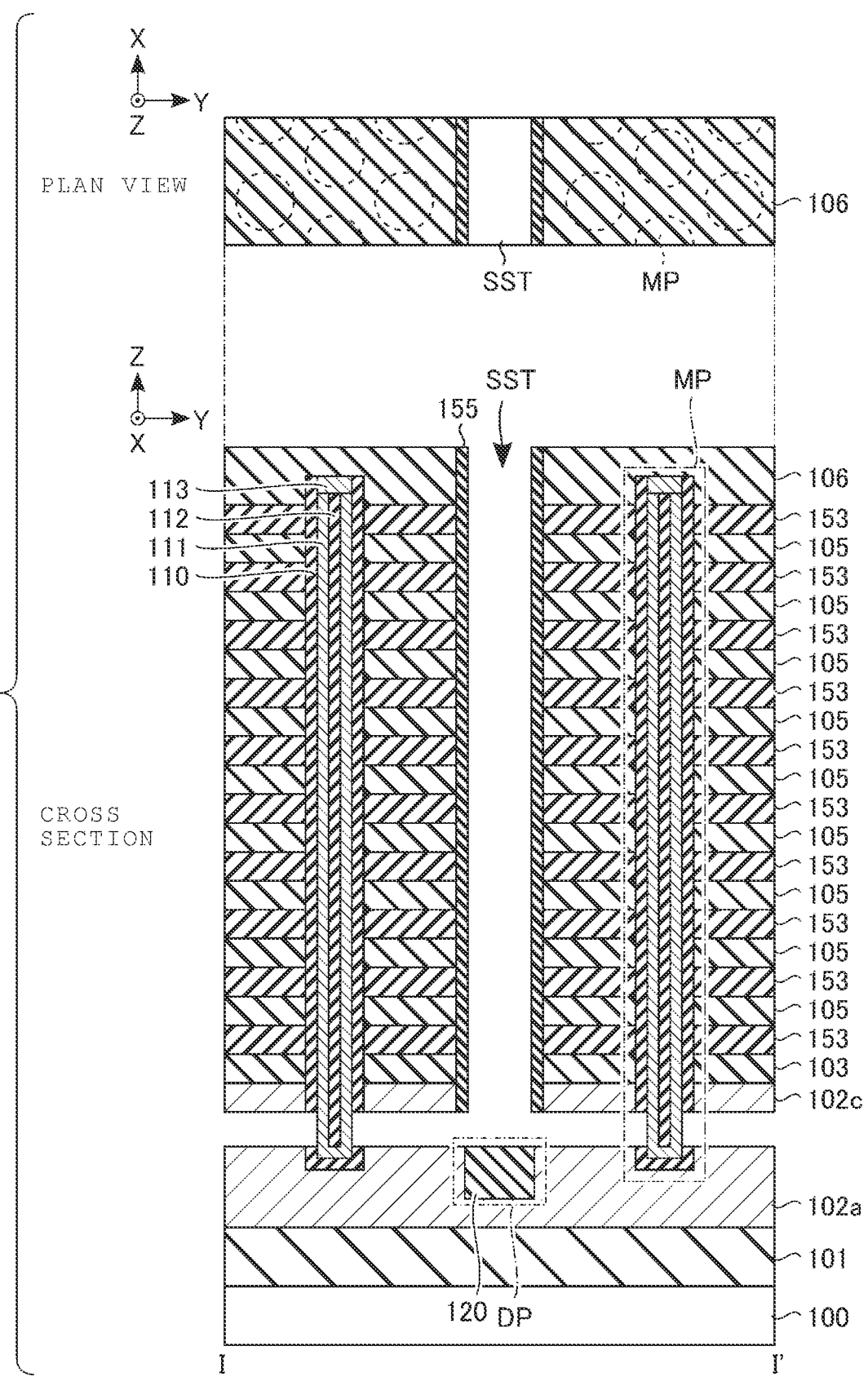

As illustrated in FIG. 15, an insulating layer 155 is formed on the side surfaces of the slit SST. For example, the insulating layer 155 comprises silicon oxide.

Next, the insulating layers 150 to 152 are removed by wet etching. Here, the stacked body 110 of the memory pillar MP and an upper portion of the insulator 120 disposed in the same layer as the insulating layers 150 to 152 are also removed.

Figure 16:
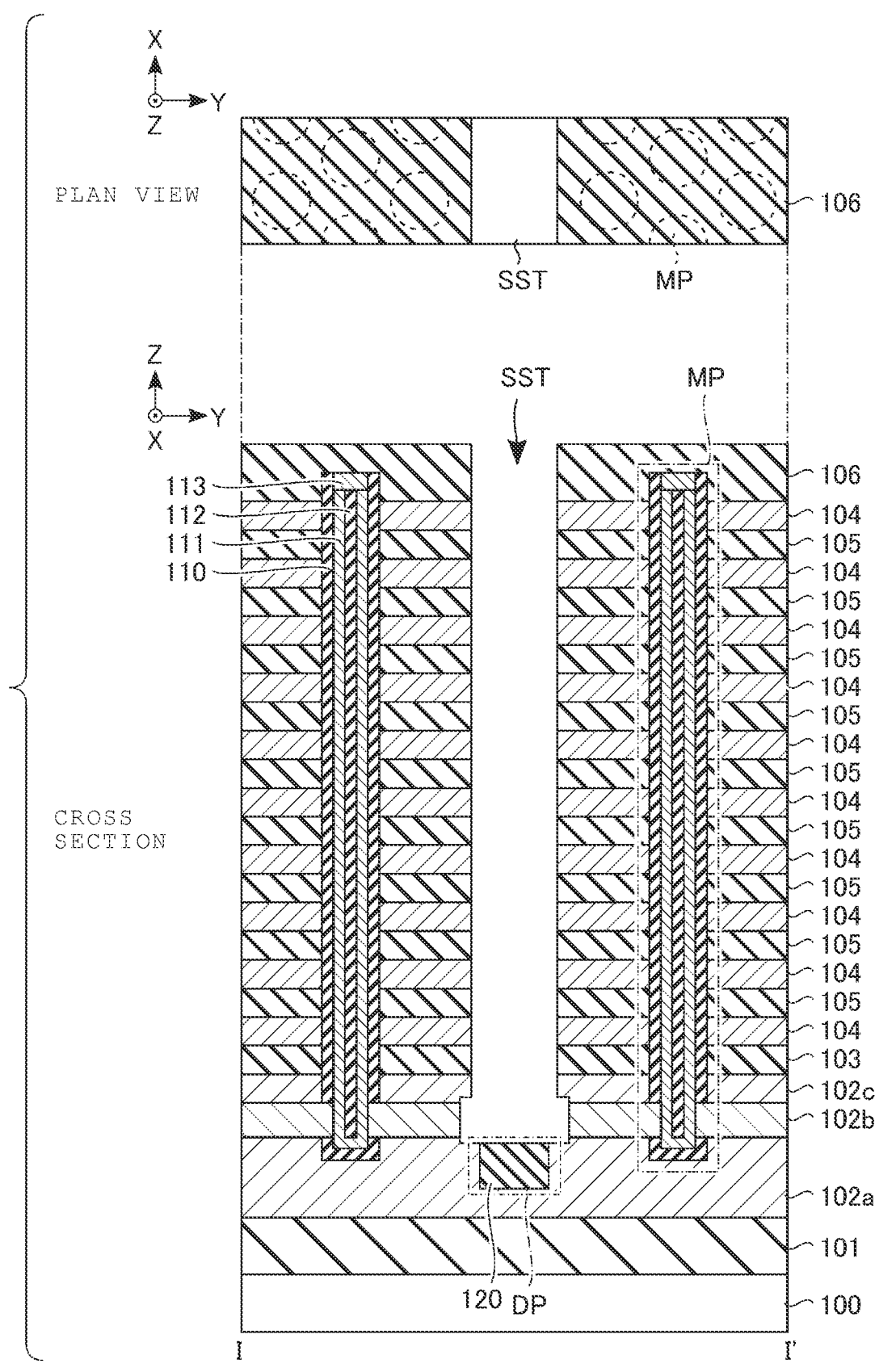

As illustrated in FIG. 16, the semiconductor layer 102b is formed. More specifically, the semiconductor layer 102b can be formed by CVD. Therefore, the regions where the insulating layers 150 to 152 and the stacked body 110 were removed can be filled. Next, the semiconductor layer 102b formed on the side surfaces of the slit SST and the insulating layer 106 are removed by wet etching, for example. Next, the insulating layer 155 on the side surfaces of the slit SST is removed by wet etching.

Next, the wiring layers 104 are formed by a replacement process. More specifically, the sacrificial layers 153 are removed by wet etching. Next, titanium nitride and then tungsten or the like is deposited sequentially by CVD to fill the region from which the sacrificial layers 153 are removed. Next, any excess titanium nitride and tungsten in the slit SST and on the insulating layer 106 are removed. Thus, the wiring layers 104 are formed.

Figure 17:
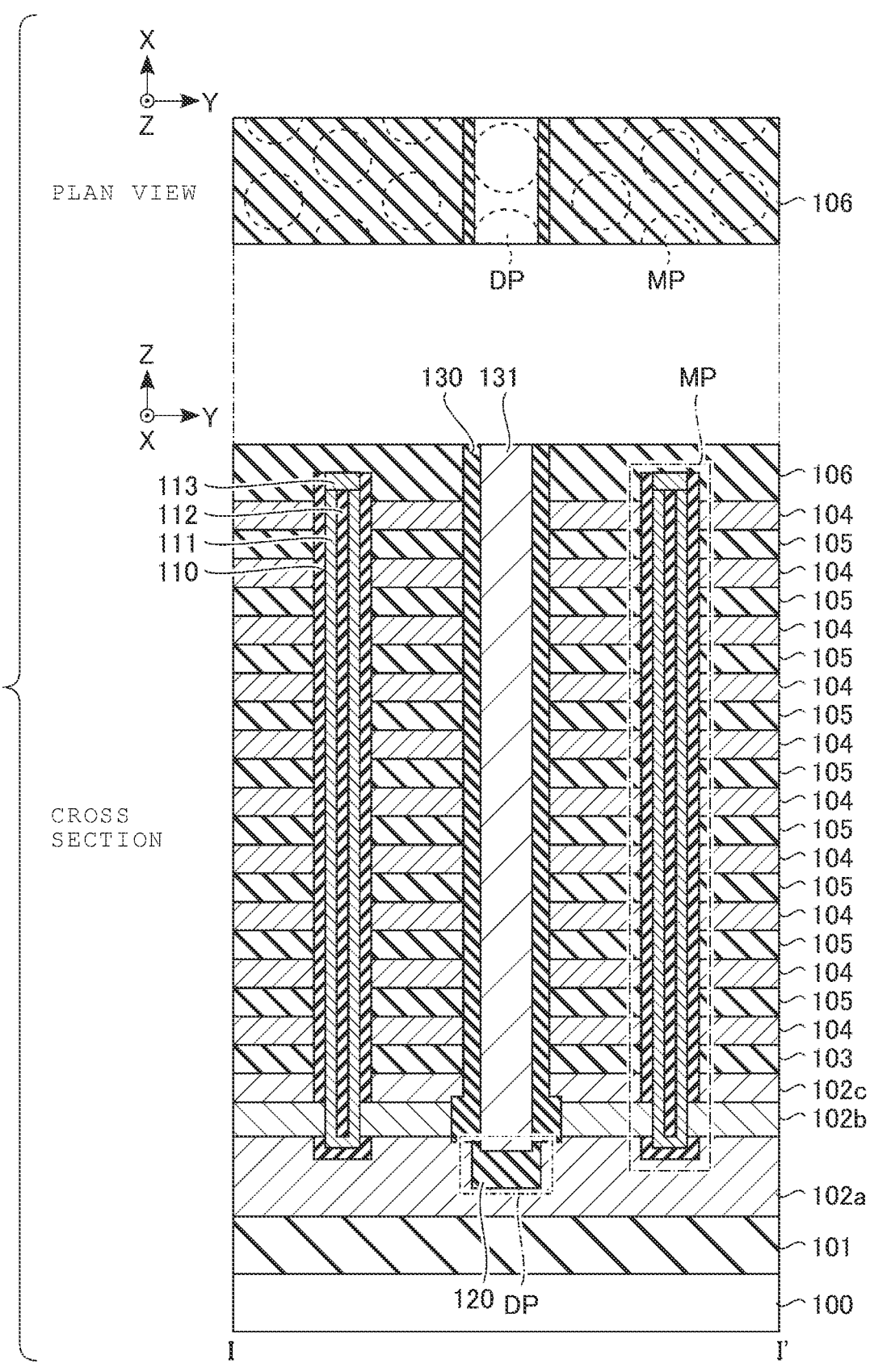

As illustrated in FIG. 17, the member SLT is formed. More specifically, the insulator 130 is formed on the side surfaces of the slit SST. Next, the inside of the slit SST is filled by the conductor 131. Thereby, the member SLT is formed.

1.3 Effect of the First Embodiment

With the configuration according to the first embodiment, a semiconductor storage device that can improve reliability can be provided.

A member SLT can be formed at the end portion of the block BLK. Therefore, the pattern density of the memory holes MH differs between the central portion and the end portion of the block BLK. Therefore, when processing the memory holes MH, variation occurs in the size or depth of the memory holes MH between the central portion and the end portion of the block BLK due to pattern density effects or the like. That is, a shape of the memory pillars MP differs between the central portion and the end portion of the block BLK. When variations occur in the shape of the memory pillars MP, the characteristics of the memory cell transistors MC vary as well. Therefore, the possibility of erroneous writing, erroneous reading, or the like is increased. Accordingly, reliability of the semiconductor memory device is lowered. The differences in the shape of the memory pillars MP increases the possibility of a reduced yield of the semiconductor memory device in manufacturing.

In contrast, with the configuration according to the first embodiment, the dummy pillars DP can be formed in the region where the member SLT will be formed. By collectively performing processing of the memory holes MH and the dummy holes DH, differences in the pattern density of the memory holes MH region to region can be reduced. Thus, variations in the shape of the memory pillars MP can be reduced. Therefore, erroneous writing or erroneous reading due to fluctuations in the characteristics of the memory cell transistors MC can be reduced. Accordingly, the reliability of the semiconductor memory device can be improved. A decrease in yield of the semiconductor memory device can be prevented.

With the configuration according to the first embodiment, the long diameter of each dummy pillar DP can be made larger than the long diameter of each memory pillar MP. Therefore, fluctuation in the pattern density of the memory holes MH between the central portion and the end portion of the block BLK can be further reduced.

2. Second Embodiment

Next, a second embodiment will be described. In the second embodiment, the disposition of the dummy pillars DP different from that in the first embodiment will be described. In the following, description will be mainly made on points that differ from the first embodiment.

2.1 Configuration of Memory Cell Array in Plan View

Figure 18:
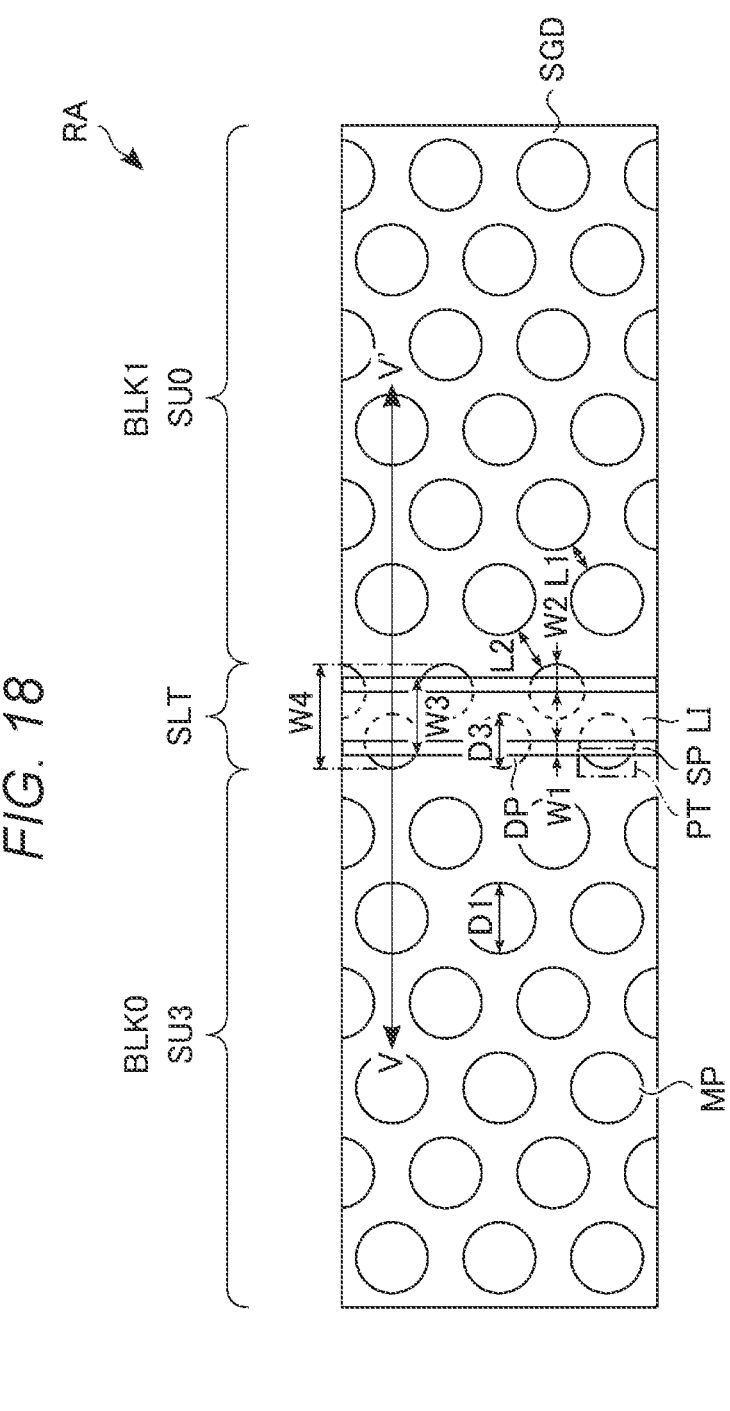
FIG. 18 is an enlarged view of aspects of a region RA in FIG. 3.

First, an example of a configuration of the memory cell array 11 in plan view will be described with reference to FIG. 18. FIG. 18 is an enlarged view of the region RA in FIG. 3 of the first embodiment. The example of FIG. 18 illustrates an upper surface of the wiring layer that functions as the select gate line SGD. An interlayer insulating film is omitted in the example of FIG. 18.

As illustrated in FIG. 18, the disposition of the memory pillars MP is the same as in FIG. 4 of the first embodiment.

In the second embodiment, a plurality of dummy pillars DP are disposed in a staggered arrangement in two rows along the X-direction. A portion of each dummy pillar remains as a protruding portion PT (insulator 120) provided on the side surfaces of the spacer SP in this embodiment. The protruding portion PT has a shape protruding curvedly in the Y-direction from the side surfaces of the spacer SP. That is, the protruding portion PT has an arc shape. For example, the protruding portion PT (insulator 120) and the spacer SP (insulator 130) can be made of the same material.

In the example of FIG. 18, a plurality of protruding portions PT are spaced apart from each other in the X-direction between the block BLK0 (wiring layer 104 of block BLK0) and the spacer SP (insulator 130). Similarly, a plurality of protruding portions PT are spaced apart from each other in the X-direction between the block BLK1 (wiring layer 104 of block BLK1) and the spacer SP (insulator 130). Thus, the plurality of protruding portions PT are disposed in a staggered arrangement in two rows along the X-direction.

The long diameters of the memory pillar MP and the dummy pillar DP in the same layer are set to D1 and D3, respectively, such that the long diameter D1 of the memory pillar MP and the long diameter D3 of the dummy pillar DP have a relationship of long diameter D1>long diameter D3. In other words, a radius of curvature of the protruding portion PT is larger than a radius of curvature of an outer circumference of the memory pillar MP.

The distance between the memory pillars MP in the block BLK is set to L1. The distance between the memory pillar MP and the protruding portion PT is set to L2, such that distance L1 and the distance L2 have a relationship of distance L1<distance L2.

The width in the Y-direction of the spacer SP is set to W1. A combined width in the Y-direction of the spacer SP and the protruding portion PT is set to W2. The width W1 and the width W2 have a relationship of W1<W2. The width in the Y-direction of the member SLT that does not include the protruding portion PT is set to W3. The width in the Y-direction of the member SLT including the protruding portion PT is set to W4. The width W3 and the width W4 have a relationship of W3<W4.

2.2 Configuration of Cross-Section of Memory Cell Array

Figure 19:
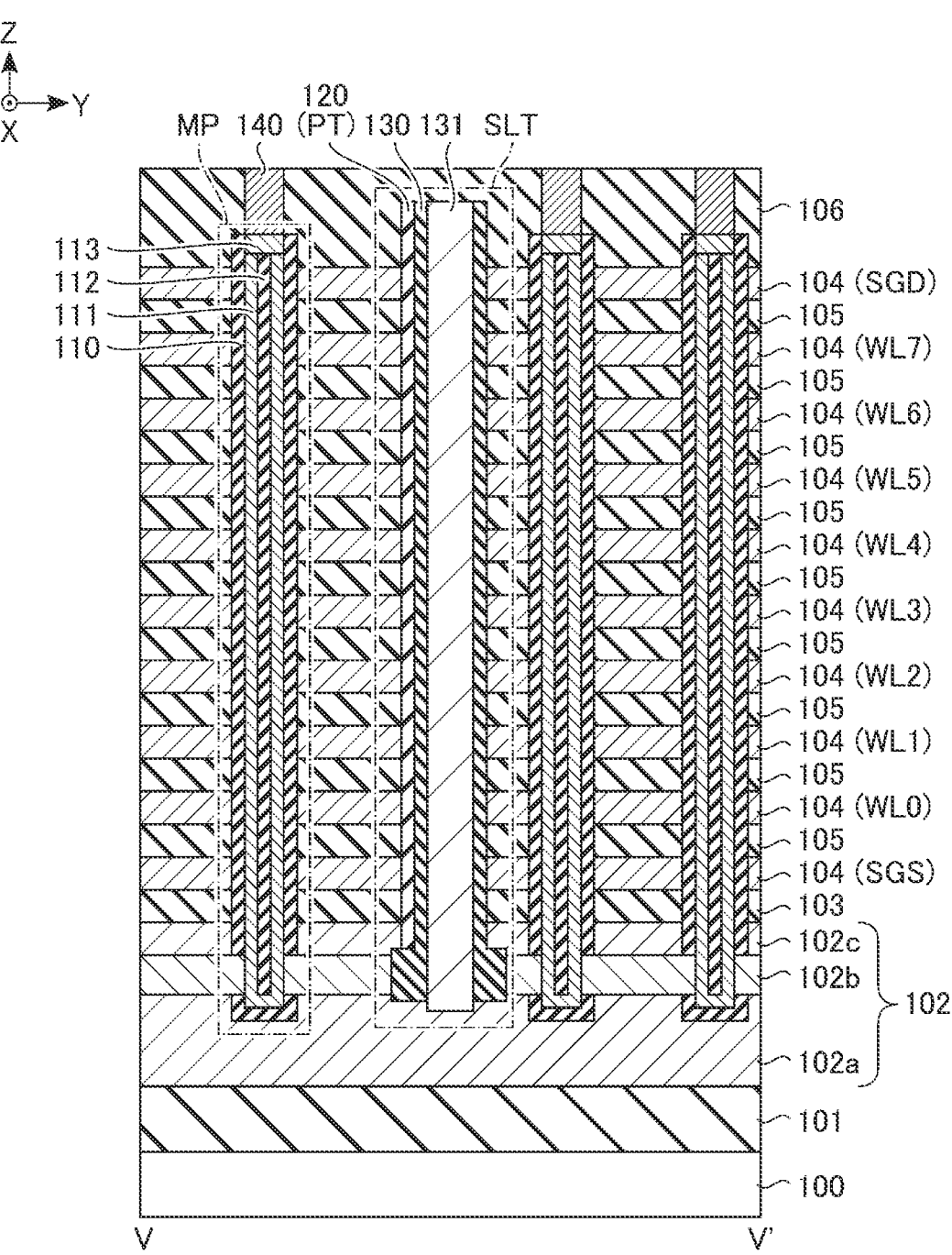
FIG. 19 is a cross-sectional view taken along line V-V' in FIG. 18.

Next, an example of a configuration of a cross-section of the memory cell array 11 will be described with reference to FIG. 19. FIG. 19 is a cross-sectional view taken along line V-V' in FIG. 18.

As illustrated in FIG. 19, the configuration of the memory pillar MP is the same as in the first embodiment.

The bottom surface of the conductor 131 is in contact with the semiconductor layer 102a. The insulator 130 is provided on the side surfaces of the conductor 131. The insulator 120 (dummy pillar DP) remains on the side surfaces of the insulator 130 as the protruding portion PT. In the example of FIG. 19, the insulator 120 is provided on the side surface of the member SLT on the left side of the paper surface. As in the first embodiment, a plurality of insulators 120 (part of dummy pillars DP) may remain at the lower end of the member SLT.

2.3 Method of Manufacturing Memory Cell Array

Next, an example of a method of manufacturing the memory cell array 11 will be described with reference to FIGS. 20 to 28. FIGS. 20 to 28 are views illustrating a shape in plan view and a cross section of the memory cell array 11 in the manufacturing process of the memory cell array 11.

Figure 20:
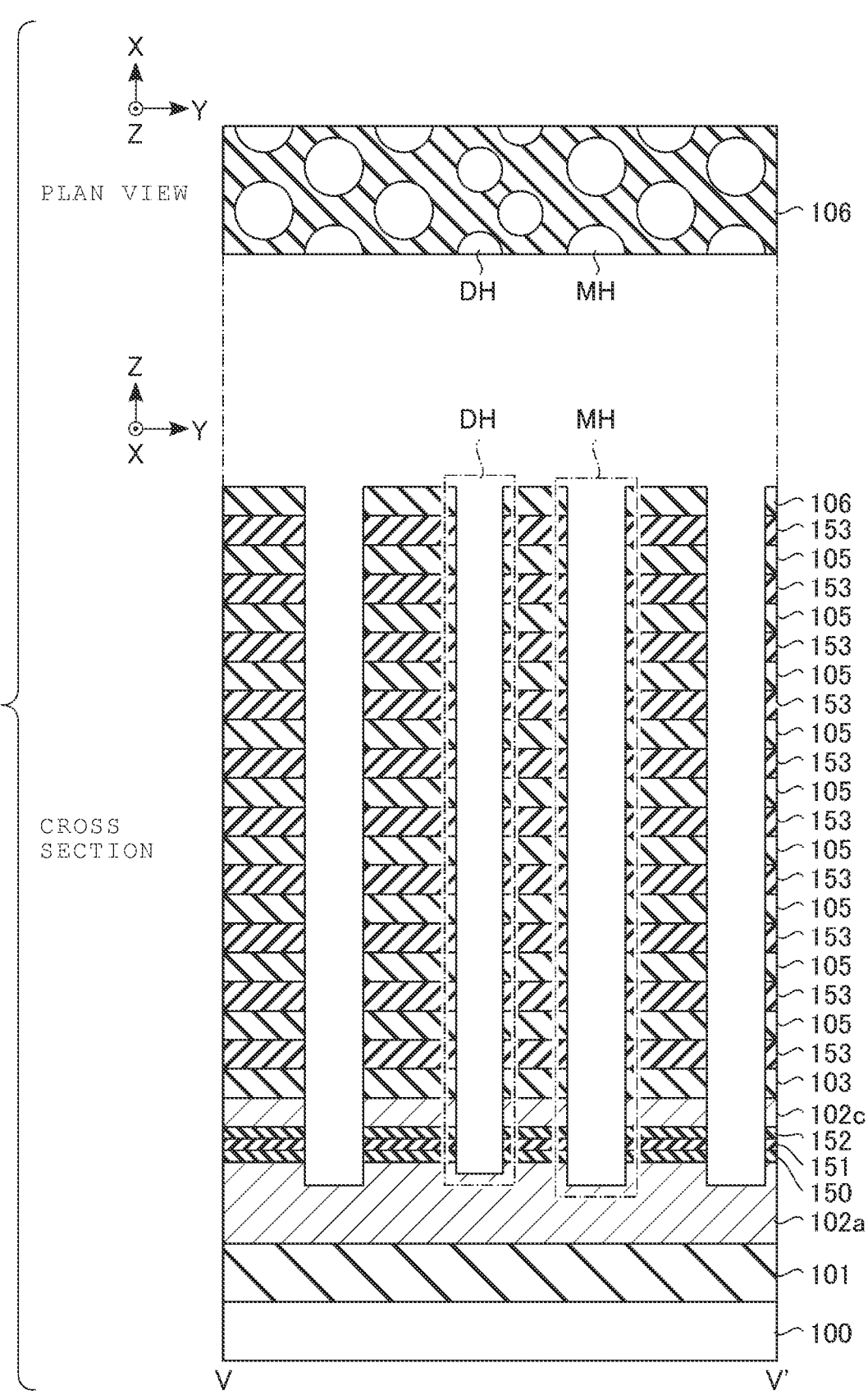
FIGS. 20 to 28 are views illustrating aspects of a manufacturing process of a memory cell array of a semiconductor memory device according to a second embodiment.

As illustrated in FIG. 20, after forming the insulating layer 106, the memory holes MH and the dummy holes DH are formed at the same time, as in the first embodiment. The bottom surfaces of the memory holes MH and the dummy holes DH reach the semiconductor layer 102a. The long diameter of the dummy hole DH in the present embodiment is less than the long diameter of the memory hole MH. Therefore, the depth from the front surface of the dummy hole DH is shallower than that of the memory hole MH. In other words, the height position of the bottom surface of the dummy hole DH in the Z-direction is higher than the height position of the bottom surface of the memory hole MH.

Figure 21:
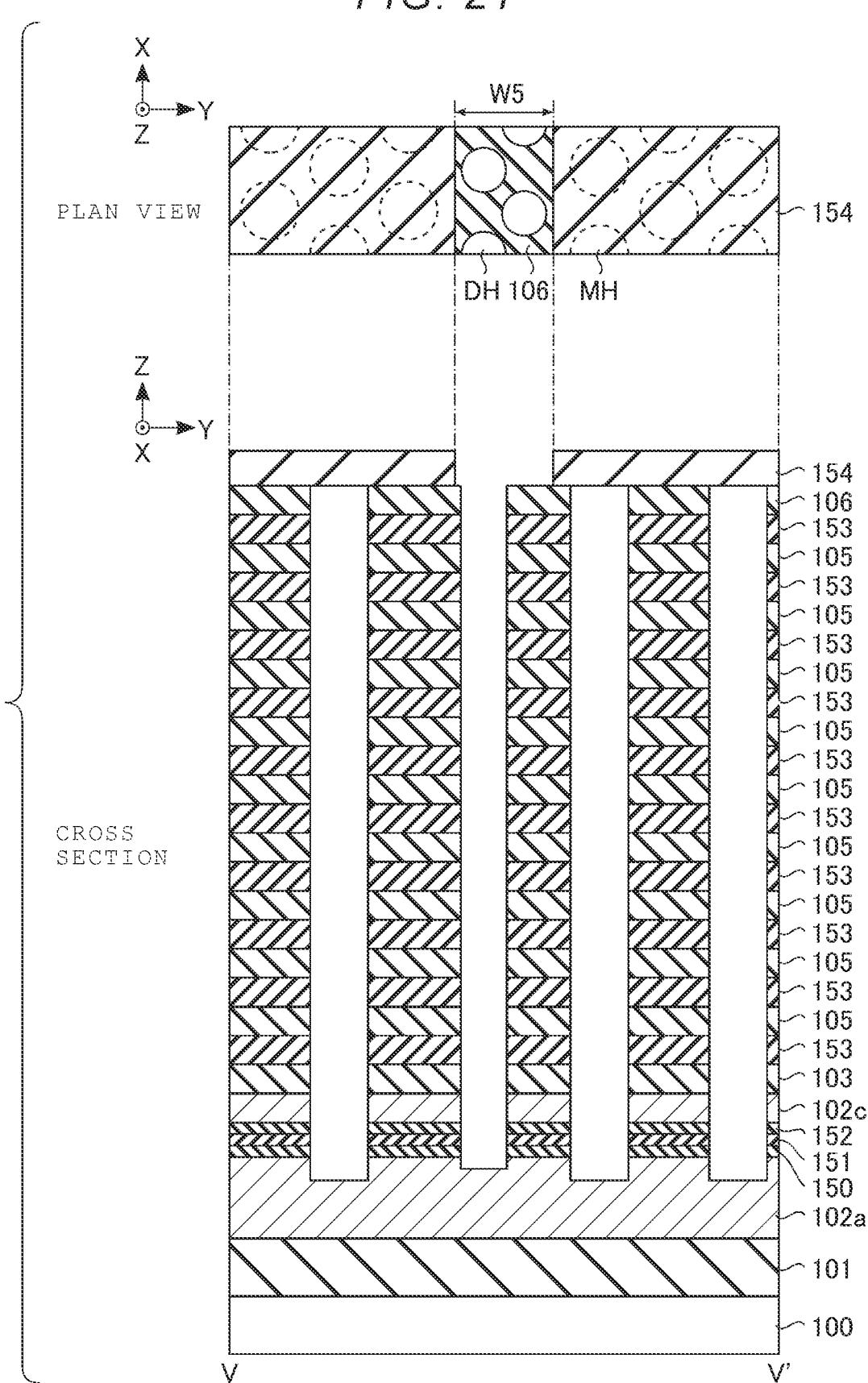

As illustrated in FIG. 21, the mask member 154 covers the memory holes MH. Here, the width in the Y-direction of a removed region of the mask member 154 is set to W5. The width W5 is set so that the dummy holes DH are completely exposed. Therefore, the width W5 is larger than the width W4 in the Y-direction of the member SLT. The distance L2 between the memory hole MH at the end of the block BLK and the dummy hole DH is larger than the distance L1 between the memory holes MH. Therefore, the possibility that the position the region in which the mask member 154 is removed is shifted onto the memory hole MH is reduced.

Figure 22:
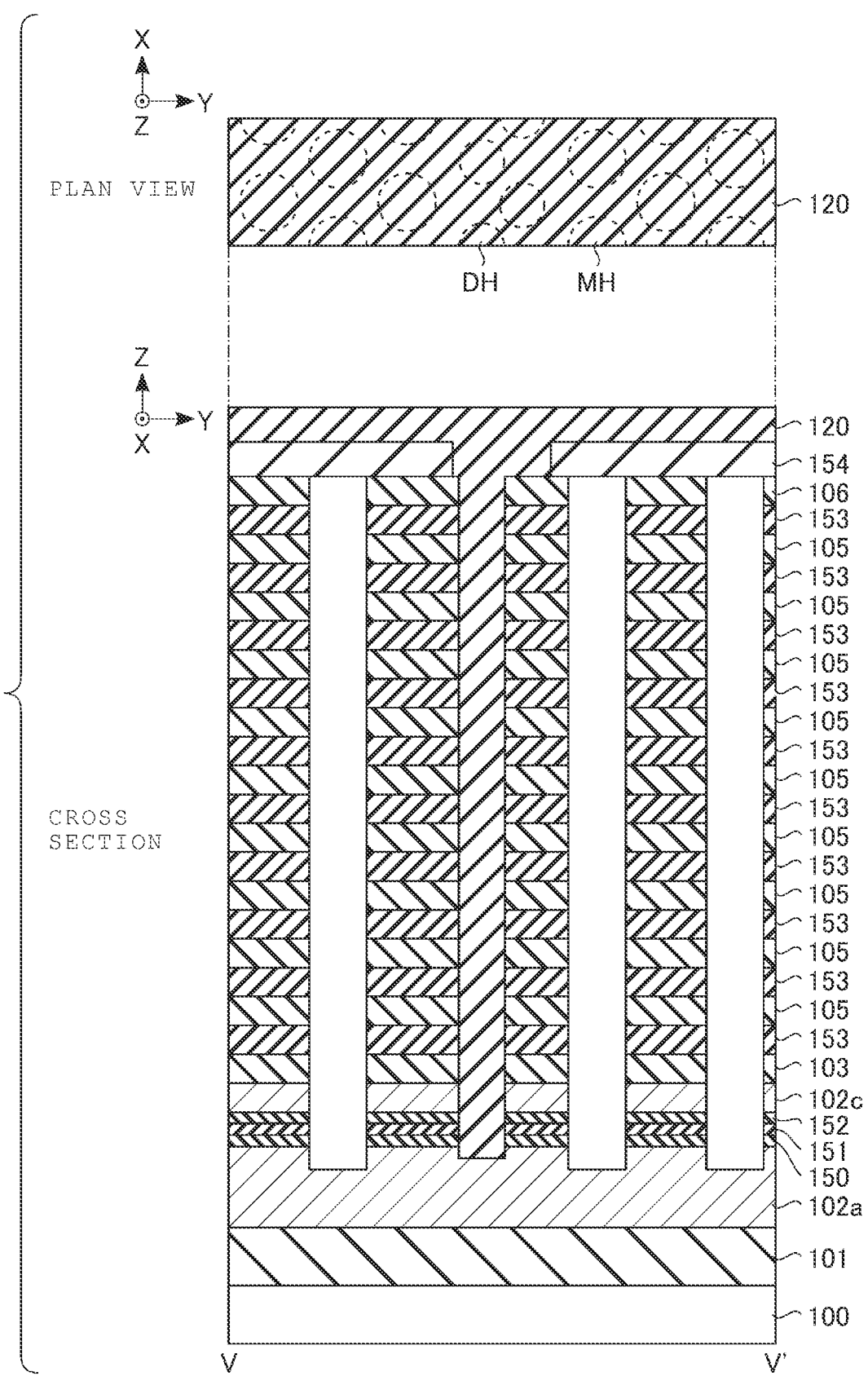

As illustrated in FIG. 22, the dummy holes DH are filled by the insulator 120 as in the first embodiment.

Figure 23:
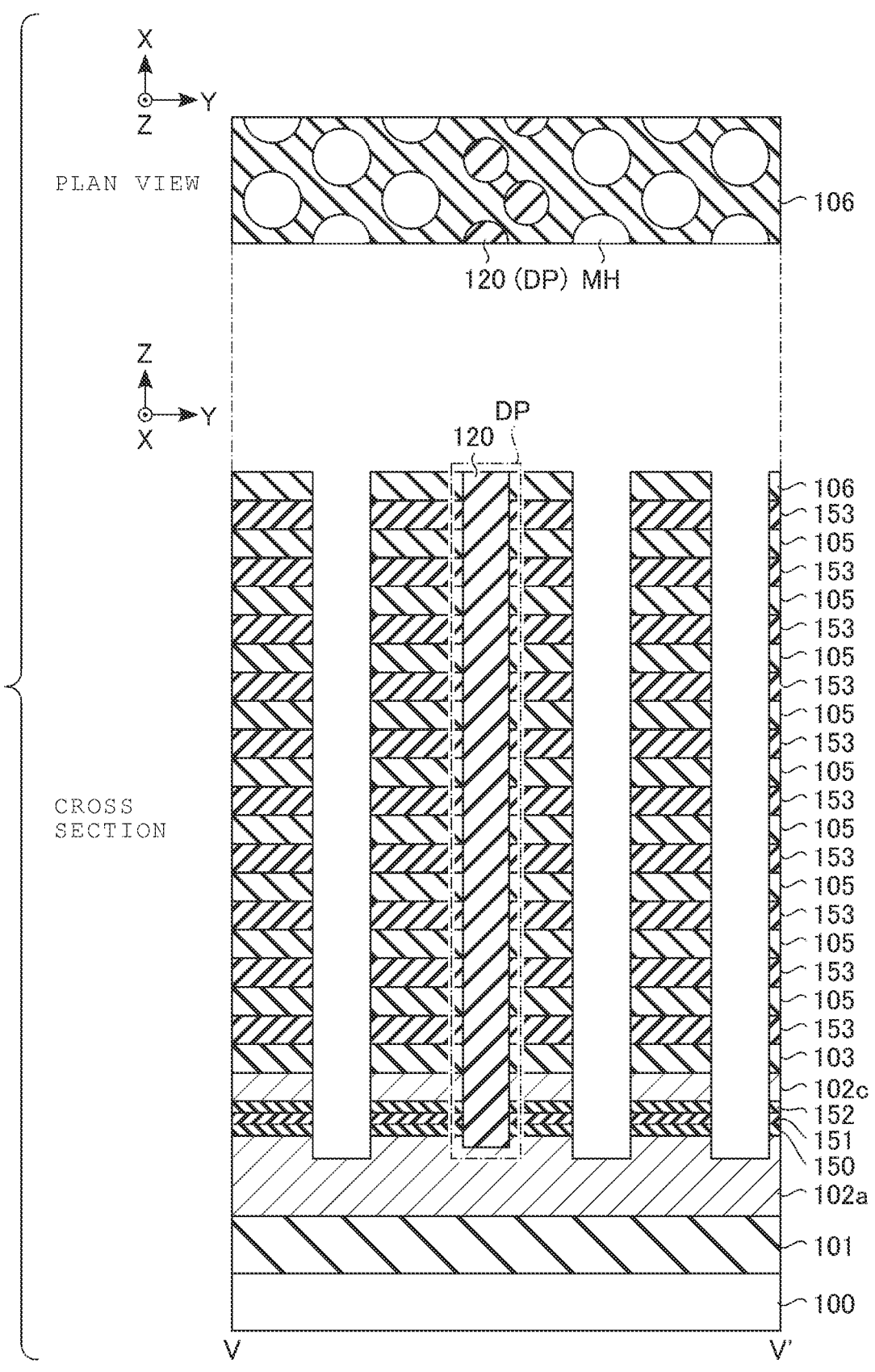

As illustrated in FIG. 23, the mask member 154 and the insulator 120 on the insulating layer 106 are removed as in the first embodiment. Therefore, each memory hole MH is opened. The dummy pillars DP filled by the insulator 120 are formed.

Figure 24:
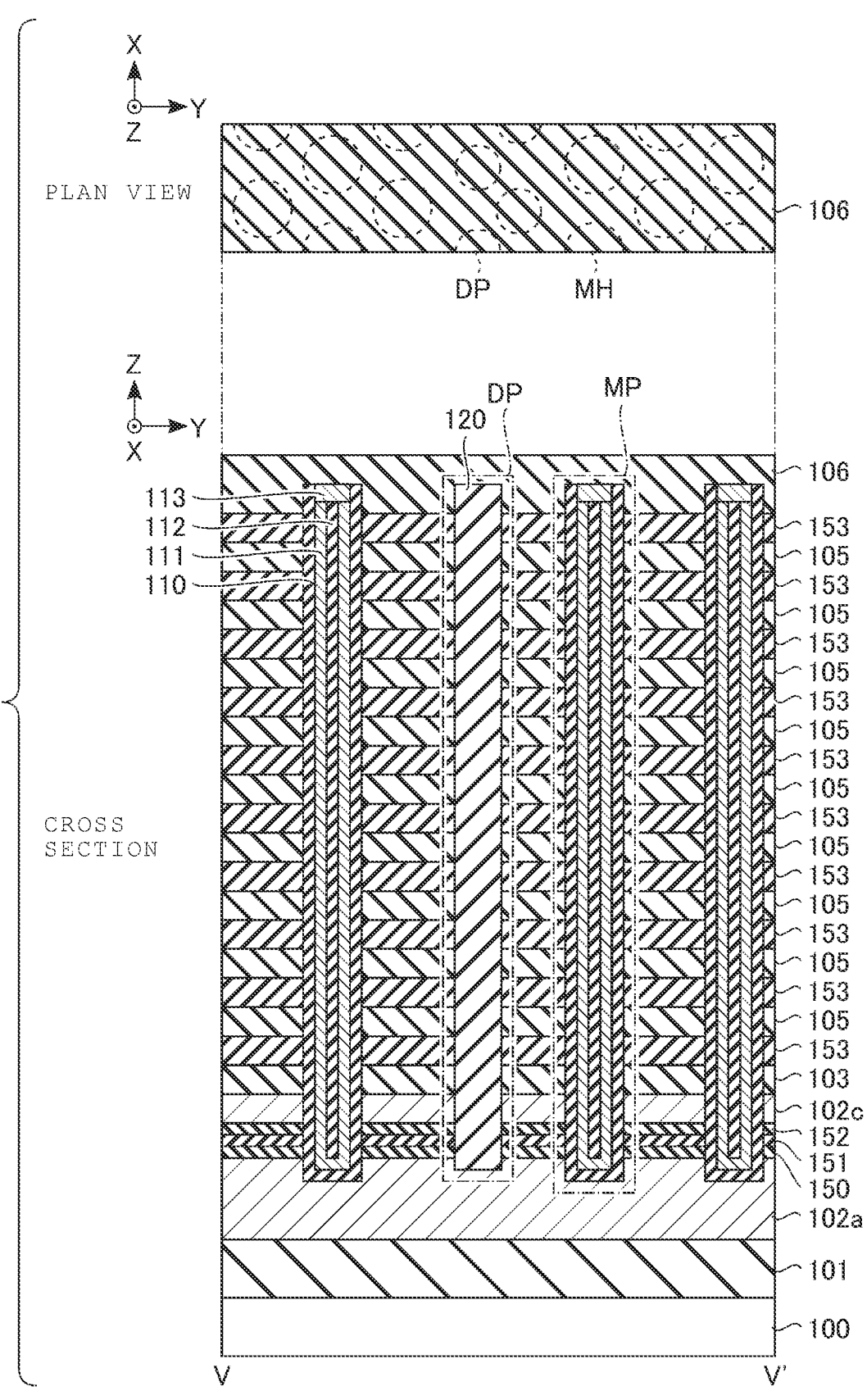

As illustrated in FIG. 24, the memory pillars MP are formed as in the first embodiment. Next, another insulating layer 106 covers the memory pillars MP and dummy pillar DP.

Figure 25:
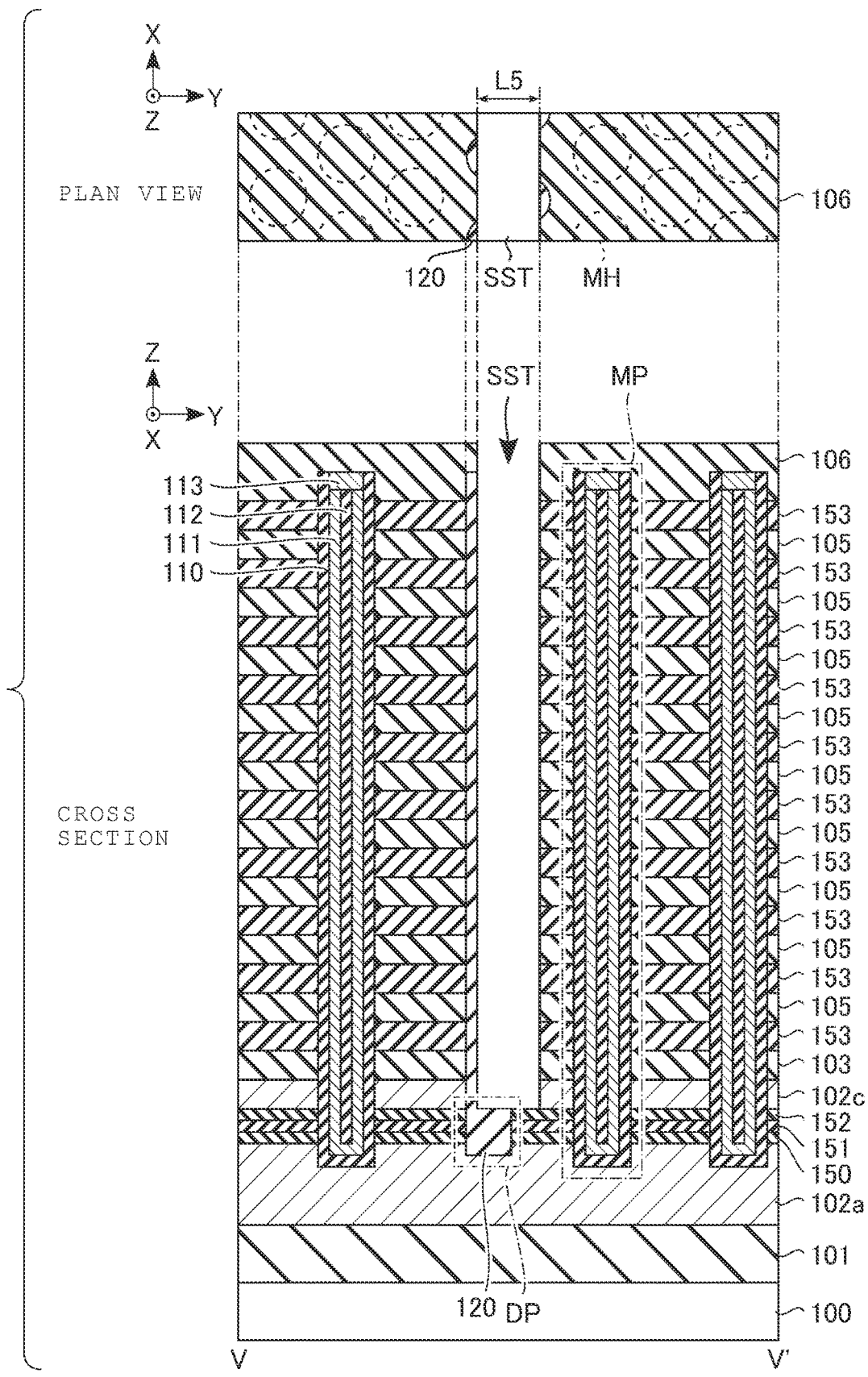

As illustrated in FIG. 25, the slit SST is formed as in the first embodiment. Here, the width of the slit SST in the Y-direction is set to the width W3 of the member SLT and does not include the protruding portions PT. The slit SST extends in the X-direction. The bottom surface of the slit SST reaches the upper surface of the insulating layer 152. The insulator 120 in a processing region of the slit SST is also processed up to the bottom surface of the slit SST.

Figure 26:
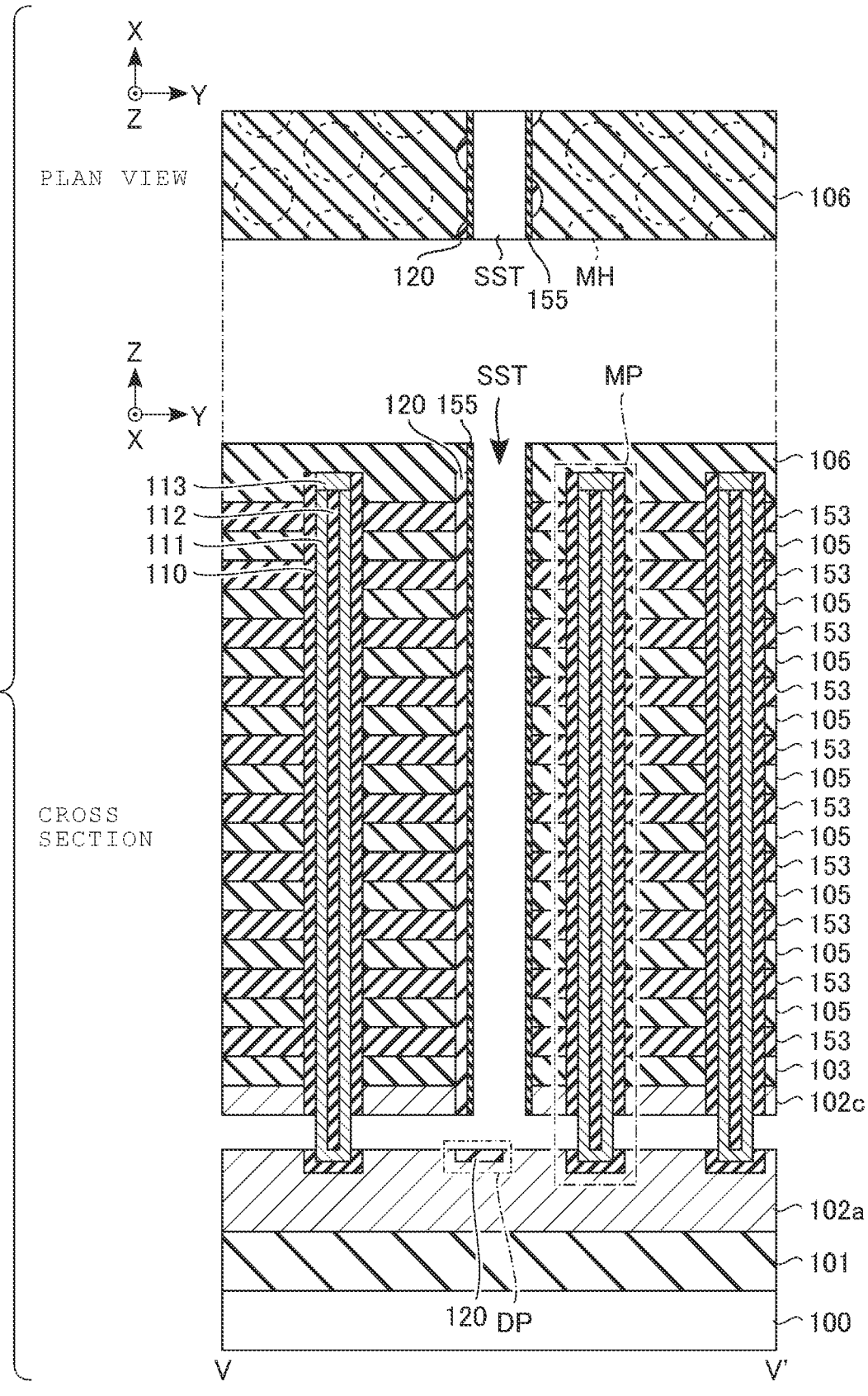

As illustrated in FIG. 26, the insulating layer 155 is formed on the side surfaces (sidewalls) of the slit SST as in the first embodiment. Next, the insulating layers 150 to 152 are removed by wet etching. Here, the stacked body 110 of the memory pillar MP and the insulator 120 that are disposed in the same layer as the insulating layers 150 to 152 are also removed. The insulator 120 (protruding portion PT) disposed between the insulating layer 103 and the sacrificial layer 153 and the insulating layer 155 and the insulator 120 disposed in the same layer as the semiconductor layer 102a remain. The insulator 120 disposed in the same layer as the semiconductor layer 102a may be removed.

Figure 27:
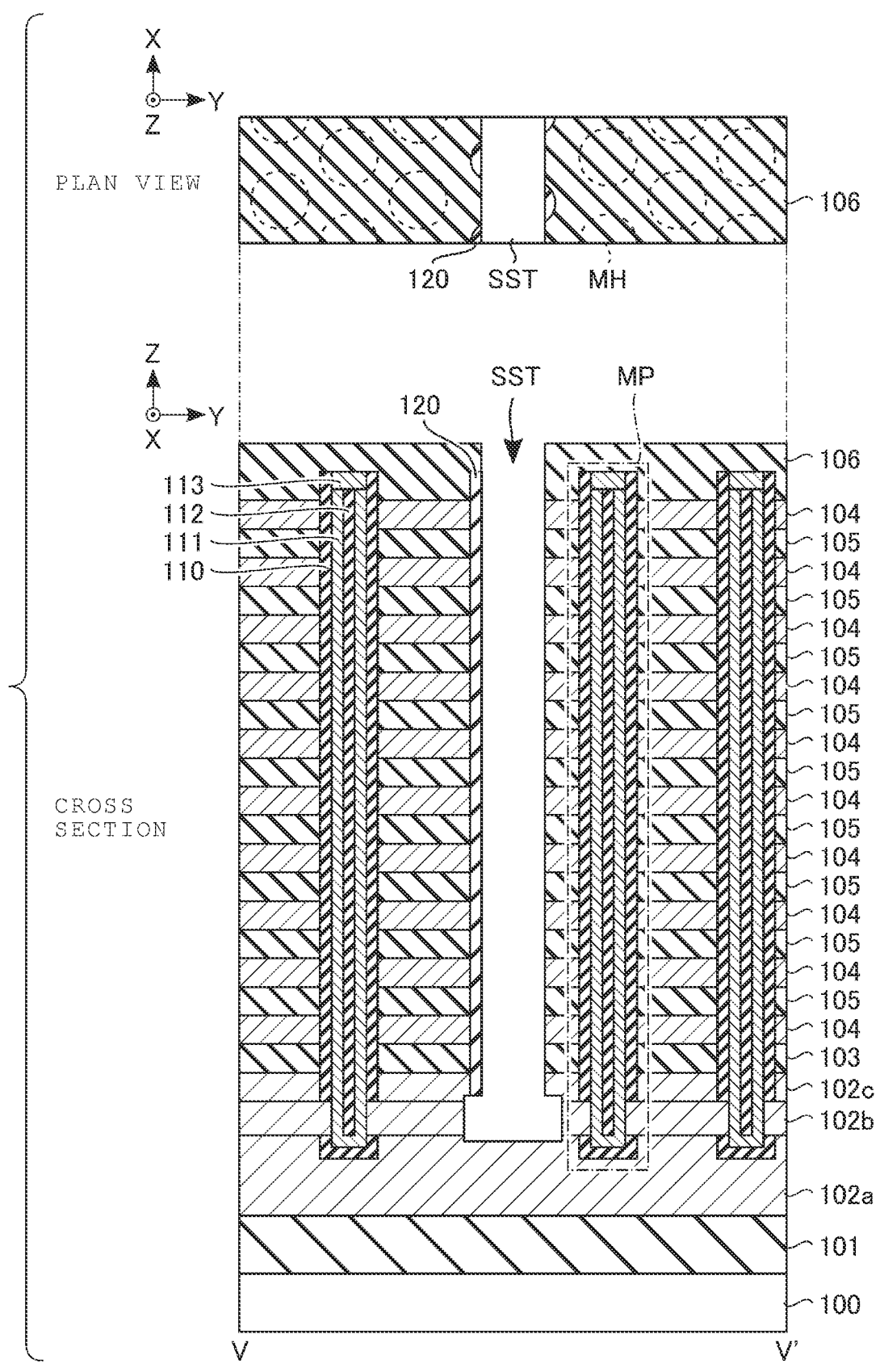

As illustrated in FIG. 27, the semiconductor layer 102b is formed. More specifically, the semiconductor layer 102b can be formed by CVD. Therefore, the regions from which the insulating layers 150 to 152 and the stacked body 110 are removed are filled. Next, the semiconductor layer 102b formed on the side surfaces of the slit SST and the insulating layer 106 are removed by wet etching, for example. Next, the insulating layer 155 on the side surfaces of the slit SST is removed by wet etching. Here, the insulator 120 (protruding portion PT) disposed on the side surfaces of the slit SST remains. The insulator 120 disposed in the same layer as the semiconductor layer 102a is removed.

Next, the wiring layer 104 is formed by a replacement process as in the first embodiment.

Figure 28:
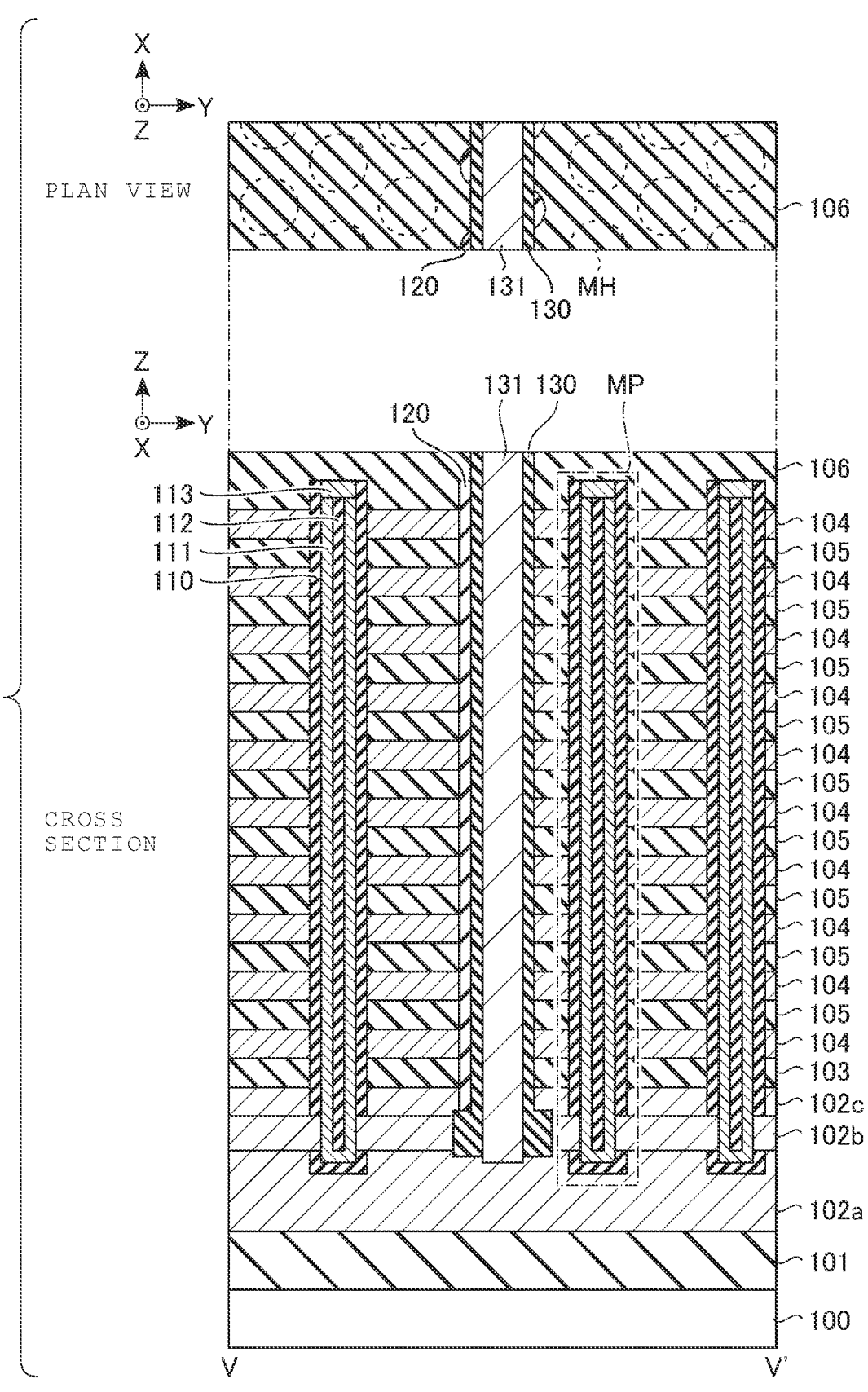

As illustrated in FIG. 28, the member SLT is formed. More specifically, for example, the insulator 130 is formed on the side surfaces of the slit SST. Next, the inside of the slit SST is filled by the conductor 131. Thereby, the member SLT is formed.

2.4 Effect of the Second Embodiment

With the configuration according to the second embodiment, the same effect as that of the first embodiment can be obtained.

With the configuration according to the second embodiment, the plurality of dummy pillars DP can be arranged in two staggered rows between blocks BLK. Therefore, fluctuations in the pattern density of the memory pillars MP between the central portion and the end portion of the block BLK can be further reduced.

With the configuration according to the second embodiment, the long diameter of the dummy pillar DP can be made less than the long diameter of the memory pillar MP. In other words, the radius of curvature of the protruding portion PT provided on the member SLT can be larger than the radius of curvature of the memory pillar MP. Therefore, the distance L2 between the dummy pillar DP and the memory pillar MP can be made larger than the distance L1 between the memory pillars MP. Therefore, the possibility that the memory hole MH is exposed when the mask member 154 covering the memory hole MH is processed can be reduced in the manufacturing process of the memory cell array 11. Therefore, the decrease in the yield of the semiconductor memory device 1 due to the defective manufacturing of the memory pillar MP can be prevented.

3. Modifications

A semiconductor memory device as described above can include a first semiconductor layer (102) provided above a semiconductor substrate in a first direction, a first wiring layer (104) provided above the first semiconductor layer in the first direction, a second wiring layer (104) disposed adjacent to the first wiring layer in a second direction intersecting the first direction, and a first memory pillar (MP) extending in the first direction through the first wiring layer. The first memory pillar (MP) may have one end connected to the first semiconductor layer. A second memory pillar (MP) in the device extends in the first direction, passes through the second wiring layer, and has one end connected to the first semiconductor layer. A first member (SLT) is provided between the first wiring layer and the second wiring layer in the second direction. The first member includes a first conductor (131) extending in the first direction and in contact with the first semiconductor layer, a first insulator (130) provided between the first wiring layer and the first conductor and between the second wiring layer and the first conductor. A plurality of second insulators (120) can be provided between the first conductor and the first semiconductor layer in the first direction.

By applying the embodiments described above, a semiconductor memory device can have improved reliability.

The term "connection" includes being directly connected and indirectly connected with something else such as a transistor or a resistor interposed between the connected elements.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
a first semiconductor layer;
a first wiring layer above the first semiconductor layer in a first direction;
a second wiring layer above the first semiconductor layer in the first direction and spaced from the first wiring layer in a second direction intersecting the first direction;
a first memory pillar extending in the first direction through the first wiring layer and having a lower end connected to the first semiconductor layer;
a second memory pillar extending in the first direction through the second wiring layer and having a lower end connected to the first semiconductor layer; and
a first member above the first semiconductor layer in the first direction, between the first and second wiring layers in the second direction, and extending in a third direction orthogonal to the first and second direction, wherein
the first member includes:
a first conductor extending in the first direction and contacting the first semiconductor layer,
a first insulator between the first wiring layer and the first conductor in the second direction and between the second wiring layer and the first conductor in the second direction, and
a plurality of second insulators arranged along the third direction and between the first conductor and the first semiconductor layer in the first direction.

2. The semiconductor memory device according to claim 1, wherein the plurality of second insulators are disposed in a line along the third direction.

3. The semiconductor memory device according to claim 1, wherein the plurality of second insulators are substantially circular in a plane including the second and third directions.

4. The semiconductor memory device according to claim 1, wherein a maximum diameter of each second insulator is larger than a maximum diameter of the first memory pillar.

5. The semiconductor memory device according to claim 1, wherein
the first semiconductor layer comprises:
a second semiconductor layer,
a third semiconductor layer on the second semiconductor layer, and
a fourth semiconductor layer on the third semiconductor layer, and
the first conductor is in contact with the second semiconductor layer.

6. The semiconductor memory device according to claim 5, wherein the plurality of second insulators are at the same distance from a semiconductor substrate in the first direction as the second semiconductor layer.

7. The semiconductor memory device according to claim 5, wherein the first insulator is between the first conductor and third semiconductor layer and between the first conductor and fourth semiconductor layer.

8. The semiconductor memory device according to claim 5, wherein a distance from a lower surface of the second semiconductor layer to the second insulators is less than a distance from the lower surface of the second semiconductor layer to the first memory pillar.

9. A semiconductor memory device, comprising:
a first semiconductor layer;
a first wiring layer above the first semiconductor layer in a first direction;
a second wiring layer above the first semiconductor layer in the first direction and spaced from the first wiring layer in a second direction intersecting the first direction;
a first memory pillar extending in the first direction through the first wiring layer and having a lower end connected to the first semiconductor layer;
a second memory pillar extending in the third direction through the second wiring layer and having a lower end connected to the first semiconductor layer; and
a first member extending in the first direction and being between the first wiring layer and the second wiring layer in the second direction and extending lengthwise in a third direction orthogonal to the first and second directions, wherein
the first member includes:
a first conductor extending in the first direction and contacting the first semiconductor layer,
a first insulator between the first wiring layer and the first conductor in the second direction and between the second wiring layer and the first conductor in the second direction,
a plurality of first protruding portions spaced apart from each other in the third direction, the first protruding portions being between the first wiring layer and the first insulator in the second direction, and
a plurality of second protruding portions spaced apart from each other in the third direction and being between the second wiring layer and the first insulator in the second direction.

10. The semiconductor memory device according to claim 9, wherein the plurality of first protruding portions and the plurality of second protruding portions are in a staggered arrangement along the third direction.

11. The semiconductor memory device according to claim 9, wherein
the first protruding portions have a curved shape, and
the radius of curvature of the first protruding portions is larger than the radius of curvature of the first memory pillar.

12. The semiconductor memory device according to claim 9, further comprising:
a third memory pillar extending in the first direction, through the first wiring layer and having a lower end connected to the first semiconductor layer, wherein
a distance from a first protruding portion nearest to the first memory pillar among the plurality of first protruding portions to the first memory pillar is longer than a distance from the first memory pillar to the third memory pillar.

13. The semiconductor memory device according to claim 9, wherein the first insulator and the plurality of first protruding portions comprise the same material.

14. The semiconductor memory device according to claim 9, wherein the first insulator and the plurality of first protruding portions are silicon oxide.

15. A semiconductor memory device, comprising:
a first semiconductor layer;
a plurality of wiring layers above the first semiconductor layer in a first direction, the wiring layers separated from each other in the first direction;
a first slit member extending through the plurality of wiring layers in the first direction;
a first memory pillar extending in the first direction through the plurality of wiring layers and having a lower end connected to the first semiconductor layer; and a second memory pillar extending in the first direction through the plurality of wiring layers and having a lower end connected to the first semiconductor layer, the first slit member being between the first and second memory pillars in a second direction intersecting the first direction, wherein the first slit member includes:

a first conductor extending in the first direction and contacting the first semiconductor layer, a first insulator sidewall portion between the first memory pillar and the first conductor in the second direction, a second insulator sidewall portion between the second memory pillar and the first conductor in the second direction, and a plurality of lower insulators arranged along a third direction orthogonal to the first and second direction and between the first conductor and the first semiconductor layer in the first direction.

16. The semiconductor memory device according to claim 15, wherein the plurality of lower insulators are disposed in a line along the third direction.

17. The semiconductor memory device according to claim 15, wherein the plurality of lower insulators are substantially circular in a plane including the second and third directions.

18. The semiconductor memory device according to claim 15, wherein a maximum diameter of each lower insulator is larger than a maximum diameter of the first memory pillar.

19. The semiconductor memory device according to claim 15, wherein the first semiconductor layer comprises:

a second semiconductor layer, a third semiconductor layer on the second semiconductor layer, and a fourth semiconductor layer on the third semiconductor layer, and the first conductor is in contact with the second semiconductor layer.

20. The semiconductor memory device according to claim 19, wherein a distance from a lower surface of the second semiconductor layer to the lower insulators is less than a distance from the lower surface of the second semiconductor layer to the first memory pillar.

* * * * *